United States Patent
Yamamoto et al.

(10) Patent No.: US 12,037,677 B2
(45) Date of Patent: *Jul. 16, 2024

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Ryuji Yamamoto, Kodaira (JP); Yoshiro Hirose, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 515 days.

This patent is subject to a terminal disclaimer.

(21) Appl. No.: 17/204,493

(22) Filed: Mar. 17, 2021

(65) Prior Publication Data

US 2021/0198785 A1    Jul. 1, 2021

Related U.S. Application Data

(62) Division of application No. 15/175,389, filed on Jun. 7, 2016, now Pat. No. 11,028,473.

(30) Foreign Application Priority Data

Jun. 10, 2015 (JP) .................. 2015-117206

(51) Int. Cl.
  *C23C 16/455* (2006.01)
  *C23C 16/02* (2006.01)
  (Continued)

(52) U.S. Cl.
  CPC .............. *C23C 16/02* (2013.01); *C23C 16/24* (2013.01); *C23C 16/45542* (2013.01);
  (Continued)

(58) Field of Classification Search
  None
  See application file for complete search history.

(56) References Cited

U.S. PATENT DOCUMENTS 8,846,546 B2   9/2014  Takeda
9,090,969 B2   7/2015  Takeda
(Continued)

FOREIGN PATENT DOCUMENTS

EP      1100117 A2     5/2001
JP    2011-249764 A   12/2011
(Continued)

OTHER PUBLICATIONS

Japanese Office Action dated Nov. 1, 2016 in the Japanese Application No. 2015-117206.
(Continued)

*Primary Examiner* — Suberr L Chi
*Assistant Examiner* — Carnell Hunter, III
(74) *Attorney, Agent, or Firm* — Volpe Koenig

(57) ABSTRACT

A method of manufacturing a semiconductor device includes forming a seed layer containing a predetermined element on a substrate by performing a process a predetermined number of times, and supplying a second precursor containing the predetermined element and not containing the ligand to the substrate to form a film containing the predetermined element on the seed layer. The process includes alternately performing: supplying a first precursor to the substrate to form an adsorption layer of the first precursor, the first precursor containing the predetermined element and a ligand which is coordinated to the predetermined element and which contains at least one of carbon or nitrogen, and supplying a ligand desorption material to the substrate to desorb the ligand from the adsorption layer of the first precursor.

21 Claims, 12 Drawing Sheets

(51) Int. Cl.
*C23C 16/24* (2006.01)
*H01L 21/02* (2006.01)
(52) U.S. Cl.
CPC .. *C23C 16/45546* (2013.01); *C23C 16/45557* (2013.01); *H01L 21/0245* (2013.01); *H01L 21/02488* (2013.01); *H01L 21/02532* (2013.01); *H01L 21/0262* (2013.01)

(56) References Cited

U.S. PATENT DOCUMENTS

| | | | |
|---|---|---|---|
| 9,093,270 B2 | 7/2015 | Hirose | |
| 9,114,438 B2 | 8/2015 | Hoinkis | |
| 9,337,015 B2 | 5/2016 | Takeda | |
| 9,613,798 B2 | 4/2017 | Yamamoto | |
| 2006/0154453 A1* | 7/2006 | Son | H01L 21/02532 438/482 |
| 2008/0124945 A1 | 5/2008 | Miya | |
| 2008/0284020 A1 | 11/2008 | Ishizaka | |
| 2009/0278224 A1 | 11/2009 | Kim et al. | |
| 2011/0263105 A1 | 10/2011 | Hasebe et al. | |
| 2012/0220137 A1 | 8/2012 | Ota | |
| 2012/0329286 A1 | 12/2012 | Takeda | |
| 2013/0102132 A1 | 4/2013 | Takeda | |
| 2013/0252439 A1 | 9/2013 | Hirose et al. | |
| 2013/0280921 A1 | 10/2013 | Takeda | |
| 2013/0323435 A1* | 12/2013 | Xiao | H01L 21/02126 546/14 |
| 2014/0080321 A1 | 3/2014 | Hirose et al. | |
| 2014/0087568 A1 | 3/2014 | Noda | |
| 2014/0179085 A1 | 6/2014 | Hirose et al. | |
| 2014/0220788 A1 | 8/2014 | Sano | |
| 2014/0227886 A1 | 8/2014 | Sano | |
| 2014/0342573 A1 | 11/2014 | Hirose | |
| 2014/0345645 A1 | 11/2014 | Hoinkis | |
| 2015/0147871 A1 | 5/2015 | Xiao et al. | |
| 2015/0179487 A1 | 6/2015 | Chen | |
| 2015/0255274 A1 | 9/2015 | Yamamoto | |
| 2015/0287594 A1 | 10/2015 | Hirose | |
| 2015/0303054 A1 | 10/2015 | Hanashima et al. | |
| 2015/0357181 A1 | 12/2015 | Yamamoto | |

FOREIGN PATENT DOCUMENTS

| | | |
|---|---|---|
| JP | 2014-013888 A | 1/2014 |
| JP | 2014-060227 A | 4/2014 |
| JP | 2014-127524 A | 7/2014 |
| JP | 2015-015465 A | 1/2015 |
| KR | 10-2009-0116433 A | 11/2009 |
| KR | 20090116433 A | 11/2009 |
| KR | 10-2013-0107232 A | 10/2013 |
| KR | 20130107232 A | 10/2013 |
| KR | 10-2015-0052219 A | 5/2015 |
| KR | 20150052219 A | 5/2015 |
| WO | 2014/080785 A1 | 5/2014 |

OTHER PUBLICATIONS

Korean Office Action dated Apr. 19, 2017 in the Korean Application No. 10-2016-0071750.

* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This non-provisional U.S. patent application is a divisional of U.S. patent application Ser. No. 15/175,389, filed on Jun. 7, 2016, which is based upon and claims the benefit of priority from Japanese Patent Application No. 2015-117206, filed on Jun. 10, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate is often carried out by supplying a precursor to the substrate accommodated within a process chamber.

SUMMARY

The present disclosure provides some embodiments of a technique capable of improving a quality of a film formed on a substrate.

According to one embodiment of the present disclosure, there is provided a technique, including: forming a seed layer containing a predetermined element on a substrate by performing a process a predetermined number of times, the process including alternately performing: supplying a first precursor to the substrate to form an adsorption layer of the first precursor, the first precursor containing the predetermined element and a ligand which is coordinated to the predetermined element and which contains at least one of carbon or nitrogen, and supplying a ligand desorption material to the substrate to desorb the ligand from the adsorption layer of the first precursor; and supplying a second precursor containing the predetermined element and not containing the ligand to the substrate to form a film containing the predetermined element on the seed layer.

DETAILED DESCRIPTION

One Embodiment of the Present Disclosure

One embodiment of the present disclosure will be described as below with reference to FIGS. 1 to 3.

(1) Configuration of the Substrate Processing Apparatus

Figure 1A:
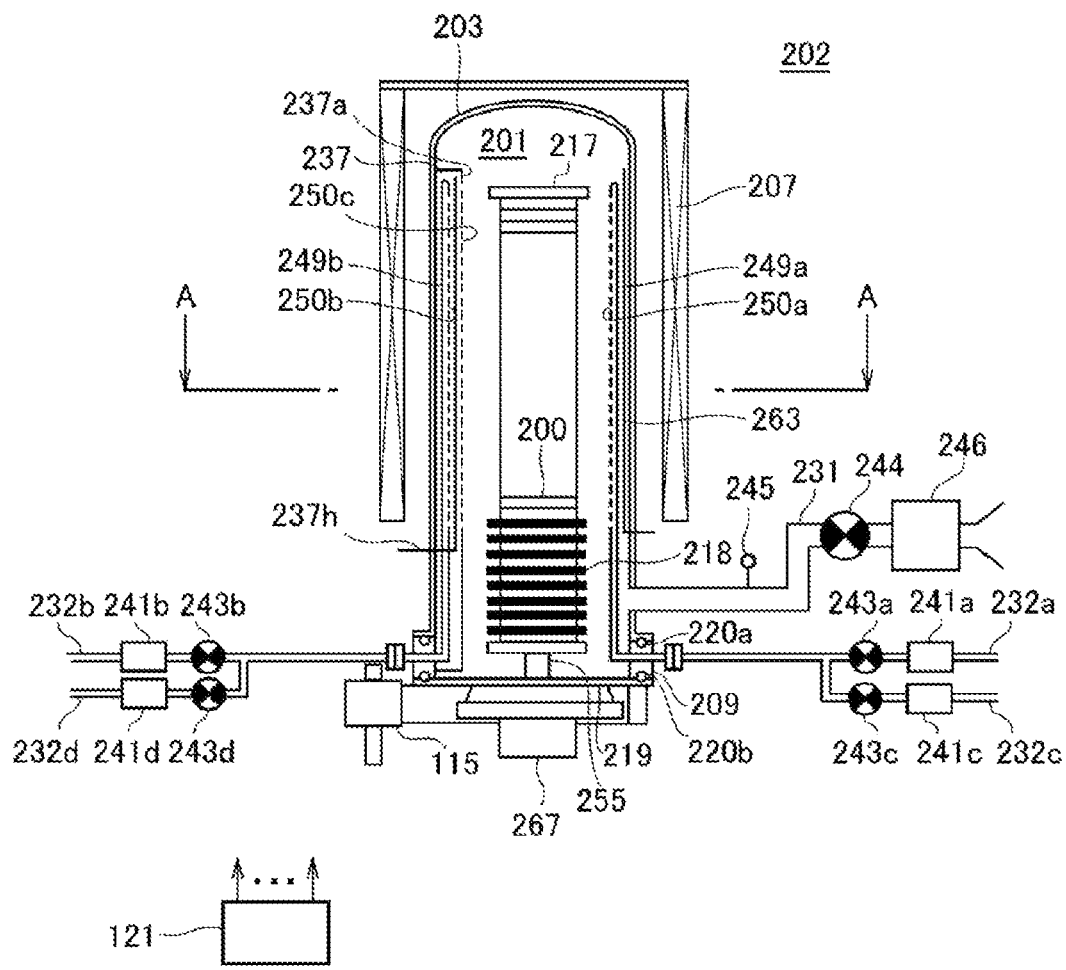
FIGS. 1A and 1B are a schematic configuration diagram of a vertical type processing furnace of a substrate processing apparatus suitably used in one embodiment of the present disclosure, in which a portion of the processing furnace is shown in a vertical cross sectional view.
Figure 1B:
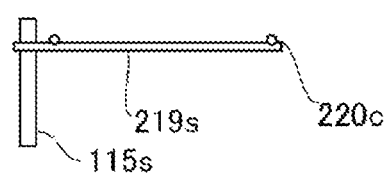

As illustrated in FIGS. 1A and 1B, a processing furnace 202 includes a heater 207 as a heating mechanism (temperature adjustment part). The heater 207 has a cylindrical shape and is supported by a heater base (not shown) serving as a retaining plate so as to be vertically installed. As will be described hereinbelow, the heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates. The wafers 200 are horizontally stacked in multiple stages along a vertical direction in a boat 217 which will be described hereinbelow.

Nozzles 249a and 249b are installed in the process chamber 201 so as to penetrate a sidewall of the manifold 209. Gas supply pipes 232a and 232b are respectively connected to the nozzles 249a and 249b. In this way, two nozzles 249a and 249b and two gas supply pipes 232a and 232b are installed in the reaction tube 203 and are capable of supplying plural types of gases into the process chamber 201.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are respectively installed in the gas supply pipes 232c and 232d sequentially from the corresponding upstream sides.

The nozzle 249a is connected to a front end portion of the gas supply pipe 232a. As illustrated in FIG. 2, the nozzle 249a is disposed in a space with an annular plan-view shape between the inner wall of the reaction tube 203 and the wafers 200 such that the nozzle 249a extends upward along a stacking direction of the wafers 200 from a lower portion of the inner wall of the reaction tube 203 to an upper portion of the inner wall of the reaction tube 203. Specifically, the nozzle 249a is installed at a lateral side of a wafer arrangement region in which the wafers 200 are arranged, namely in a region which horizontally surrounds the wafer arrangement region, so as to extend along the wafer arrangement region. That is, the nozzle 249a is installed in a perpendicular relationship with the surfaces (flat surfaces) of the wafers 200 at a lateral side of the end portions (peripheral edge portions) of the wafers 200 which are carried into the process chamber 201. The nozzle 249a is configured as an L-shaped nozzle. A horizontal portion of the nozzle 249a is installed to penetrate a sidewall of the manifold 209. A vertical portion of the nozzle 249a is installed to extend upward at least from one end portion of the wafer arrangement region toward the other end portion of the wafer arrangement region. Gas supply holes 250a for supplying a gas are formed on the side surface of the nozzle 249a. The gas supply holes 250a are opened toward the center of the reaction tube 203 so as to allow a gas to be supplied toward the wafers 200. The gas supply holes 250a may be formed in a plural number between the lower portion of the reaction tube 203 and the upper portion of the reaction tube 203. The respective gas supply holes 250a may have the same aperture area and may be formed at the same aperture pitch.

The nozzle 249b is connected to a front end portion of the gas supply pipe 232b. The nozzle 249b is installed within a buffer chamber 237 which is a gas diffusion space. The buffer chamber 237 is formed between the inner wall of the reaction tube 203 and a partition wall 237a. As illustrated in FIG. 2, the buffer chamber 237 (the partition wall 237a) is installed in a space with an annular plan-view shape between the inner wall of the reaction tube 203 and the wafers 200 such that the buffer chamber 237 (the partition wall 237a) extends along the stacking direction of the wafers 200 from the lower portion of the inner wall of the reaction tube 203 to the upper portion of the inner wall of the reaction tube 203. That is, the buffer chamber 237 (the partition wall 237a) is installed at the lateral side of the wafer arrangement region, namely in the region which horizontally surrounds the wafer arrangement region, so as to extend along the wafer arrangement region. Gas supply holes 250c for supplying a gas are formed in an end portion of the surface of the partition wall 237a which faces (adjoins) the wafers 200. The gas supply holes 250c are opened toward the center of the reaction tube 203 so as to allow a gas to be supplied toward the wafers 200. The gas supply holes 250c may be formed in a plural number between the lower portion of the reaction tube 203 and the upper portion of the reaction tube 203. The respective gas supply holes 250c may have the same aperture area and may be formed at the same aperture pitch.

The nozzle 249b is installed in an end portion of the buffer chamber 237 opposite to the end portion of the buffer chamber 237 having the gas supply holes 250c such that the nozzle 249b extends upward along the stacking direction of the wafers 200 from the lower portion of the inner wall of the reaction tube 203 to the upper portion of the reaction tube 203. Specifically, the nozzle 249b is installed at the lateral side of the wafer arrangement region in which the wafers 200 are arranged, namely in the region which horizontally surrounds the wafer arrangement region, so as to extend along the wafer arrangement region. That is, the nozzle 249b is installed in a perpendicular relationship with the surfaces of the wafers 200 at the lateral side of the end portions of the wafers 200 which are carried into the process chamber 201. The nozzle 249b is configured as an L-shaped nozzle. A horizontal portion of the nozzle 249b is installed to penetrate the sidewall of the manifold 209. A vertical portion of the nozzle 249b is installed to extend upward at least from one end portion of the wafer arrangement region toward the other end portion of the wafer arrangement region. Gas supply holes 250b for supplying a gas are formed on the side surface of the nozzle 249b. The gas supply holes 250b are opened toward the center of the buffer chamber 237. Similar to the gas supply holes 250c, the gas supply holes 250b may be formed in a plural number between the lower portion of the reaction tube 203 and the upper portion of the reaction tube 203. In the case where the differential pressure between the interior of the buffer chamber 237 and the interior of the process chamber 201 is small, the aperture area and the aperture pitch of the gas supply holes 250b may be respectively set to remain constant between the upstream side (lower portion) and the downstream side (upper portion) of the nozzle 249b. In the case where the differential pressure between the interior of the buffer chamber 237 and the interior of the process chamber 201 is large, the aperture area of the gas supply holes 250b may be set to become gradually larger from the upstream side toward the downstream side of the nozzle 249b, or the aperture pitch of the gas supply holes 250b may be set to become gradually smaller from the upstream side toward the downstream side of the nozzle 249b.

By adjusting the aperture area or the aperture pitch of the gas supply holes 250b between the upstream side and the downstream side as mentioned above, it is possible to inject a gas from the gas supply holes 250b at different flow velocities but at a substantially equal flow rate. The gas injected from the respective gas supply holes 250b is first introduced into the buffer chamber 237. This makes it possible to equalize the flow velocities of the gas within the buffer chamber 237. The gas injected from the respective gas supply holes 250b into the buffer chamber 237 is injected from the gas supply holes 250c into the process chamber 201 after the particle velocity of the gas is relaxed within the buffer chamber 237. The gas injected from the respective gas supply holes 250b into the buffer chamber 237 has a uniform flow rate and a uniform flow velocity when injected from the respective gas supply holes 250c into the process chamber 201.

As described above, in the present embodiment, a gas is transferred through the nozzles 249a and 249b and the buffer chamber 237, which are disposed in a vertically-elongated space with an annular plan-view shape, i.e., a cylindrical space, defined by the inner surface of the side wall of the reaction tube 203 and the end portions (peripheral edge portions) of the wafers 200 arranged within the reaction tube 203. The gas is initially injected into the reaction tube 203, near the wafers 200, through the gas supply holes 250a to 250c formed in the nozzles 249a and 249b and the buffer chamber 237. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a film formed on each of the wafers 200. In addition, the gas flowing on the surfaces of the wafers 200 after the reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A first precursor, which includes silicon (Si) as a predetermined element and a ligand which is coordinated to the Si and which contains at least one of carbon (C) or nitrogen (N), for example, an aminosilane precursor gas, is supplied from the gas supply pipe 232a into the process chamber 201 via the MFC 241a, the valve 243a and the nozzle 249a.

The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. When the term "precursor" is used herein, it may refer to "a liquid precursor staying in a liquid state," "a precursor gas staying in a gaseous state," or both. Furthermore, the aminosilane precursor refers to a silane precursor having an amino group and a silane precursor having an alkyl group such as a methyl group, an ethyl group, a butyl group or the like. The aminosilane precursor is a precursor containing at least Si, C and N. That is, the aminosilane precursor referred to herein may be said to be an organic precursor or may be said to be an organic aminosilane precursor. As the aminosilane precursor gas, it may be possible to use, for example, a diisopropylaminosilane ($SiH_3N[CH(CH_3)_2]_2$, abbreviation: DIPAS) gas. The DIPAS gas may be said to be a precursor gas which contains one Si atom in one molecule and which has a Si—N bond, a Si—H bond, an N—C bond or the like but does not have a Si—C bond. The DIPAS gas acts as a Si source at a seed layer forming step which will be described later. In the case of using a liquid precursor such as DIPAS or the like which stays in a liquid state under a room temperature and an atmospheric pressure, the precursor of a liquid state is vaporized by a vaporization system such as a vaporizer, a bubbler or the like and is supplied as a silane precursor gas (a DIPAS gas, etc.).

A second precursor, which contains Si as a predetermined element and which does not contain the aforementioned ligand, for example, a silane hydride precursor gas (silicon hydride gas), is supplied from the gas supply pipe 232a into the process chamber 201 via the MFC 241a, the valve 243a and the nozzle 249a. The silicon hydride gas refers to a silane precursor gas which contains H and which does not contain C and N. As the silicon hydride gas, it may be possible to use a substance represented by a chemical formula, $Si_xH_y$ (where x or y is an integer of 1 or more), for example, a monosilane ($SiH_4$) gas. The $SiH_4$ gas may be said to be a precursor gas which contains one Si atom in one molecule and which has a Si—H bond but does not have a Si—C bond, a Si—N bond and an N—C bond. The $SiH_4$ gas acts as a Si source at a CVD film forming step which will be described later.

A ligand desorption material is supplied from the gas supply pipes 232a and 232b into the process chamber 201 via the MFCs 241a and 241b, the valves 243a and 243b, the nozzles 249a and 249b, and the buffer chamber 237.

As the ligand desorption material, it may be possible to use a plasma-excited reducing gas or a non-plasma-excited reducing gas.

As the reducing gas, it may be possible to use at least one H-containing gas selected from a group consisting of a hydrogen ($H_2$) gas and a deuterium ($D_2$) gas. Furthermore, as the reducing gas, it may be possible to use, for example, at least one H-containing gas selected from a group consisting of the aforementioned silicon hydride gas and a boron hydride gas containing boron (B). As the silicon hydride gas, it may be possible to use, in addition to the aforementioned $SiH_4$ gas, for example, at least one gas selected from a group consisting of a disilane ($Si_2H_6$) gas, a trisilane ($Si_3H_8$) gas and a tetrasilane ($Si_4H_{10}$) gas. As the boron hydride gas, it may be possible to use a substance represented by a chemical formula, $B_xH_y$ (where x or y is an integer of 1 or more), for example, at least one gas selected from a group consisting of a borane ($BH_3$) gas, a diborane ($B_2H_6$) gas, a triborane ($B_3H_8$ or $B_3H_9$) gas and a tetraborane ($B_4H_{10}$ or $B_4H_{12}$) gas.

Furthermore, as the ligand desorption material, it may be possible to use a plasma-excited inert gas. As the inert gas, it may be possible to use at least one gas selected from a group consisting of a nitrogen ($N_2$) gas and a rare gas. As the rare gas, it may be possible to use at least one gas selected from a group consisting of an argon (Ar) gas, a helium (He) gas, a neon (Ne) gas and a xenon (Xe) gas.

Moreover, as the ligand desorption material, it may be possible to use a plasma-excited inert gas and a non-plasma-excited reducing gas together. That is, it may be possible to use a mixture of a plasma-excited inert gas and a non-plasma-excited reducing gas. In this case, the non-plasma-excited reducing gas is indirectly excited by the plasma-excited inert gas. As the non-plasma-excited reducing gas, it may be possible to use a thermally-excited reducing gas.

In addition, as the ligand desorption material, it may be possible to use a halogen-element-containing gas. As the halogen-element-containing gas, it may be possible to use, for example, at least one gas selected from a group consisting of a chlorine (Cl)-containing gas and a fluorine (F)-containing gas.

As the Cl-containing gas, it may be possible to use, in addition to a chlorine ($Cl_2$) gas and a hydrogen chloride (HCl) gas, for example, a gas containing Si and Cl, such as a chlorosilane gas or the like. As the chlorosilane gas, it may be possible to use, for example, a dichlorosilane (SiH$_2$Cl$_2$, abbreviation: DCS) gas or a hexachlorodisilane (Si$_2$Cl$_6$: abbreviation: HCDS) gas.

As the F-containing gas, it may be possible to use, in addition to a fluorine (F$_2$) gas, a nitrogen fluoride (NF$_3$) gas, a chlorine fluoride (ClF$_3$) gas and a hydrogen fluoride (HF) gas, for example, a gas containing Si and F, such as a fluorosilane gas or the like. As the fluorosilane gas, it may be possible to use, for example, a tetrafluorosilane (SiF$_4$) gas or a hexafluorodisilane (Si$_2$F$_6$) gas.

An inert gas, for example, an N$_2$ gas, is supplied from the gas supply pipes 232c and 232d into the process chamber 201 via the MFCs 241c and 241d, the valves 243c and 243d, the gas supply pipes 232a and 232b, the nozzles 249a and 249b, and the buffer chamber 237.

In the case where the aforementioned first precursor is supplied from the gas supply pipe 232a, a first precursor supply system as a first supply system is mainly configured by the gas supply pipe 232a, the MFC 241a and the valve 243a. The nozzle 249a may be regarded as being included in the first precursor supply system. The first precursor supply system may be referred to as a first precursor gas supply system. In the case where an aminosilane precursor gas is supplied as the first precursor, the first supply system may be referred to as an aminosilane precursor gas supply system or an aminosilane precursor supply system.

In the case where the aforementioned second precursor is supplied from the gas supply pipe 232a, a second precursor supply system as a second supply system is mainly configured by the gas supply pipe 232a, the MFC 241a and the valve 243a. The nozzle 249a may be regarded as being included in the second precursor supply system. The second precursor supply system may be referred to as a second precursor gas supply system. In the case where a silicon hydride gas is supplied as the second precursor, the second supply system may be referred to as a silicon hydride gas supply system or a silicon hydride precursor supply system.

In the case where the aforementioned ligand desorption material is supplied from the gas supply pipe 232a, a ligand desorption material supply system as a third supply system is mainly configured by the gas supply pipe 232a, the MFC 241a and the valve 243a. The nozzle 249a may be regarded as being included in the ligand desorption material supply system. Furthermore, in the case where the aforementioned ligand desorption material is supplied from the gas supply pipe 232b, a ligand desorption material supply system as a third supply system is mainly configured by the gas supply pipe 232b, the MFC 241b and the valve 243b. The nozzle 249b and the buffer chamber 237 may be regarded as being included in the ligand desorption material supply system. The ligand desorption material supply system may be referred to as a ligand desorption gas supply system.

Furthermore, an inert gas supply system is mainly configured by the gas supply pipes 232c and 232d, the MFCs 241c and 241d, and the valves 243c and 243d.

Figure 2:
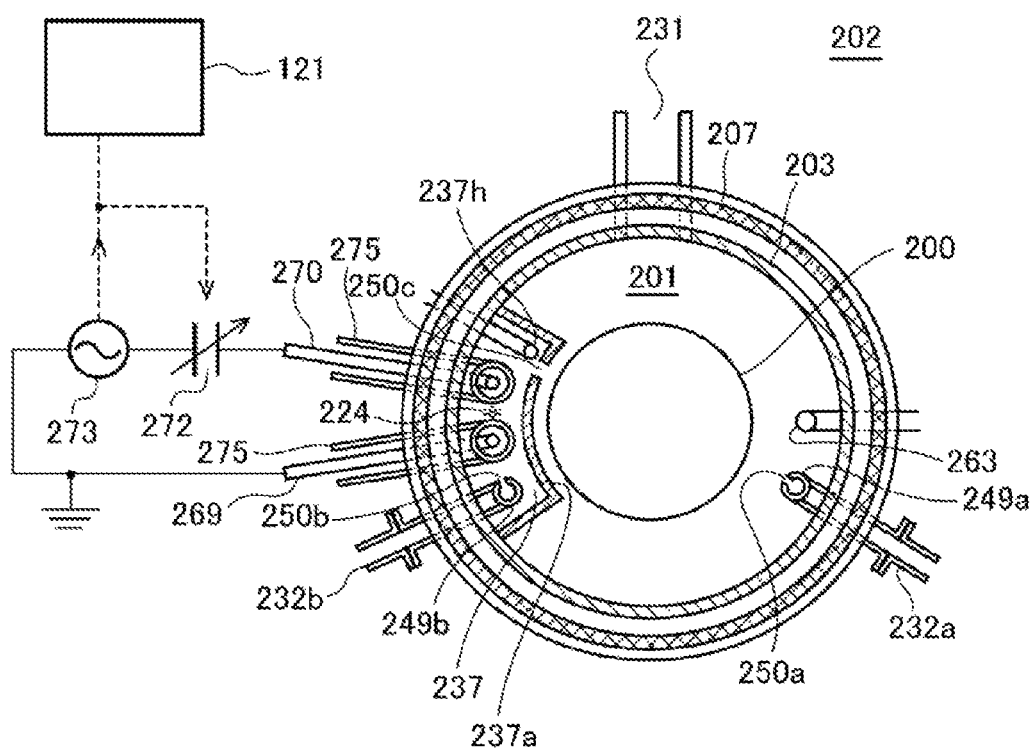
FIG. 2 is a schematic configuration diagram of the vertical type processing furnace of the substrate processing apparatus suitably used in one embodiment of the present disclosure, in which a portion of the processing furnace is shown in a cross sectional view taken along line A-A in FIG. 1A.

As illustrated in FIG. 2, two rod-shaped electrodes 269 and 270 made of a conductive material and having an elongated structure are disposed within the buffer chamber 237 so as to extend along the arrangement direction of the wafers 200 from the lower portion of the reaction tube 203 to the upper portion of the reaction tube 203. The respective rod-shaped electrodes 269 and 270 are installed parallel to the nozzle 249b. Each of the respective rod-shaped electrodes 269 and 270 is covered with and protected by an electrode protection tube 275 from the lower portion to the upper portion of rod-shaped electrodes 269 and 270. One of the rod-shaped electrodes 269 and 270 is connected to a high-frequency power source 273 via a matcher 272 and the other is connected to a ground which is a reference potential. By applying radio-frequency (RF) power from the high-frequency power source 273 to between the rod-shaped electrodes 269 and 270, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be regarded s being included in the plasma source. As will be described later, the plasma source functions as a plasma excitation part (activation mechanism) for plasma-exciting a gas, namely exciting (or activating) a gas in a plasma state. Within the buffer chamber 237, an electric heating wire (hot wire) 237h capable of heating the buffer chamber 237 to an ultra-high temperature of, for example, about 1,000 to 1,500 degrees C., may be installed as a gas activation mechanism.

The electrode protection tubes 275 have a structure that enables the respective rod-shaped electrodes 269 and 270 to be inserted into the buffer chamber 237 in a state in which the rod-shaped electrodes 269 and 270 are isolated from the internal atmosphere of the buffer chamber 237. If an O concentration within the electrode protection tubes 275 is substantially equal to an O concentration in the ambient air, the rod-shaped electrodes 269 and 270 respectively inserted into the electrode protection tubes 275 may be oxidized by the heat generated from the heater 207. By filling an inert gas such as an N$_2$ gas or the like into the electrode protection tubes 275, or by purging the interior of the electrode protection tubes 275 with an inert gas such as an N$_2$ gas or the like through the use of an inert gas purge mechanism, it is possible to reduce the O concentration within the electrode protection tubes 275 and to prevent the oxidation of the rod-shaped electrodes 269 and 270.

An exhaust pipe 231 as an exhaust flow path configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as an exhaust valve (pressure regulation part). The APC valve 244 is a valve configured so that the vacuum exhaust of the interior of the process chamber 201 and the vacuum exhaust stop can be performed by opening and closing the APC valve 243 while operating the vacuum pump 246 and so that the internal pressure of the process chamber 201 can be adjusted by adjusting the opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system. The exhaust pipe 231 is not limited to being installed in the reaction tube 203 but may be installed in the manifold 209 just like the nozzles 249a and 249b.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of hermetically seal the lower end opening of the manifold 209 while moving the seal cap 219 down with the boat elevator 115 is installed under the manifold 209. The shutter 219s is made of metal such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
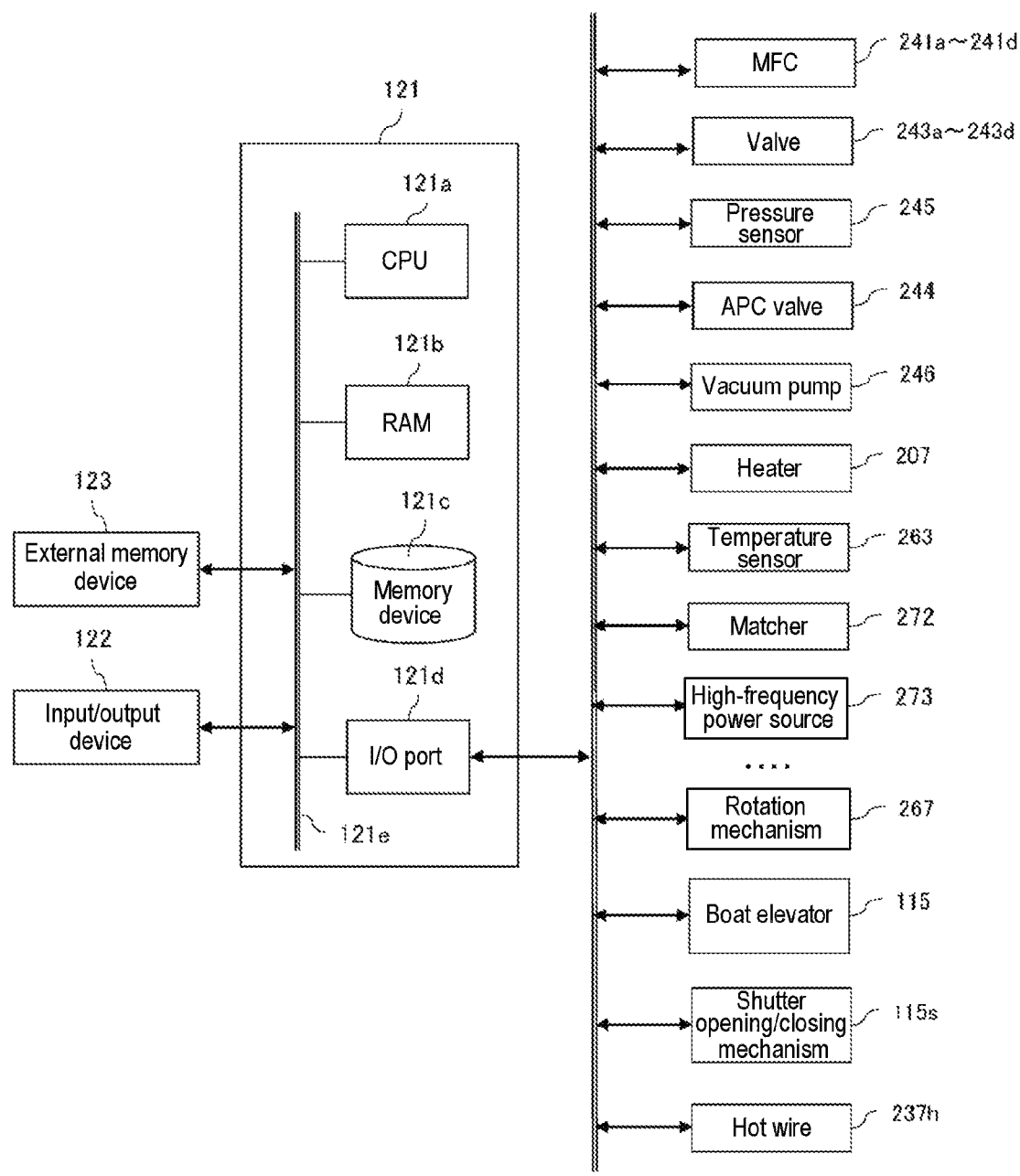
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, a process recipe for specifying sequences and conditions of a film forming process as described hereinbelow, or the like is readably stored in the memory device 121c. The process recipe functions as a program for causing the controller 121 to execute each sequence in the film forming process, as described hereinbelow, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the high-frequency power source 273, the hot wire 237h, and the like.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, the impedance adjustment operation using the matcher 272, the power supply to the high-frequency power source 273 and the hot wire 237h, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing

A sequence example of forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

In the film forming sequence illustrated in FIG. 4, there are performed: a seed layer forming step of forming a Si-containing seed layer (Si seed layer) on a wafer 200 by alternately performing, a predetermined number of times (n times), a step of supplying a DIPAS gas as a first precursor to the wafer 200 as a substrate to form an adsorption layer of DIPAS and a step of supplying a plasma-excited $H_2$ gas (hereinafter also referred to as a $H_2^*$ gas) as a ligand desorption material to the wafer 200 to desorb an amino ligand from the adsorption layer of DIPAS; and a CVD film forming step of supplying a $SiH_4$ gas as a second precursor to the wafer 200 to form a silicon film (CVD-Si film) as a Si-containing film on the seed layer.

In the present disclosure, for the sake of convenience, the sequence of the film forming process illustrated in FIG. 4 may sometimes be denoted as follows. The same denotation will be used in the modifications and other embodiments as described hereinbelow.

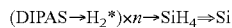

$(DIPAS \rightarrow H_2^*) \times n \rightarrow SiH_4 \Rightarrow Si$

When the term "wafer" is used herein, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Loading Step)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1A, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

As an insulation film, a SiO film, which is an oxide film, is formed in advance on at least a portion of the surface of the wafer 200. This film becomes at least a portion of a base film of the seed layer at the seed layer forming step which will be described later. This film may be formed so as to cover the entire surface of the wafer 200 or may be formed so as to cover only a portion of the surface of the wafer 200.

In addition to the oxide film, a nitride film, an oxynitride film, an oxycarbonitride film, an oxycarbide film, a carbonitride film, a borocarbonitride film, a boronitride film or the like may be formed as the insulation film. That is, in addition to the SiO film, for example, a Si-containing film such as a silicon nitride film (SiN film), a silicon oxynitride film (SiON film), a silicon oxycarbonitride film (SiOCN film), a silicon oxycarbide film (SiOC film), a silicon carbonitride film (SiCN film), a silicon borocarbonitride film (SiBCN film), a silicon boronitride film (SiBN film) or the like may be formed as the insulation film. Furthermore, a metal oxide film such as an aluminum oxide film (AlO film), a hafnium oxide film (HfO film), a zirconium oxide film (ZrO film), a titanium oxide film (TiO film) or the like, namely a high-dielectric-constant insulation film (high-k film), may be formed as the insulation film. That is, the insulation film may be a high-k film such as an HfO film, a ZrO film or the like, or may be a low-k film such as a SiOCN film, a SiOC film, a SiBN film, a SiBCN film or the like. The insulation film referred to herein includes not only a film intentionally formed by performing a specified process such as, e.g., a CVD process, a plasma CVD process, a thermal oxidizing process, a thermal nitriding process, a plasma oxidizing process, a plasma nitriding process or the like, but also a natural oxide film naturally formed as the surface of the wafer 200 is exposed to the air during the transfer of the wafer 200. In addition to the aforementioned insulation film, a conductor film (metal film) such as an aluminum film (Al film), a tungsten film (W film), a titanium nitride film (TiN film) or the like, or a semiconductor film such as a poly-silicon film (poly-Si film) or the like, may be formed on at least a portion of the surface of the wafer 200.

(Pressure Regulation and Temperature Adjustment Step)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature (a first temperature as described hereinbelow). In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Seed Layer Forming Step)

Next, the following two steps, i.e., steps 1 and 2, are sequentially performed.

[Step 1]

At this step, a DIPAS gas is supplied to the wafer 200 accommodated within the process chamber 201.

Specifically, the valve 243a is opened to allow a DIPAS gas to flow through the gas supply pipe 232a. The flow rate of the DIPAS gas is adjusted by the MFC 241a. The DIPAS gas is supplied into the process chamber 201 via the nozzle 249a and is exhausted from the exhaust pipe 231. At this time, the DIPAS gas is supplied to the wafer 200. Simultaneously, the valve 243c is opened to allow an $N_2$ gas to flow through the gas supply pipe 232c. The flow rate of the $N_2$ gas is adjusted by the MFC 241c. The $N_2$ gas is supplied into the process chamber 201 together with the DIPAS gas and is exhausted from the exhaust pipe 231. Furthermore, in order to prevent the DIPAS gas from entering the buffer chamber 237 and the nozzle 249b, the valve 243d is opened to allow the $N_2$ gas to flow through the gas supply pipe 232d. The $N_2$ gas is supplied into the process chamber 201 via the gas supply pipe 232b, the nozzle 249b and the buffer chamber 237 and is exhausted from the exhaust pipe 231.

The supply flow rate of the DIPAS gas controlled by the MFC 241a may be set at a flow rate which falls within a range of, for example, 10 to 1,000 sccm, specifically 10 to 500 sccm. The supply flow rates of the $N_2$ gas controlled by the MFCs 241c and 241d may be respectively set at a flow rate which falls within a range of, for example, 100 to 10,000 sccm. The internal pressure of the process chamber 201 may be set at a pressure which falls within a range of, for example, 1 to 2,666 Pa, specifically 67 to 1,333 Pa. The time period, during which the DIPAS gas is supplied to the wafer 200, namely the gas supply time period (the irradiation time period), may be set at a time period which falls within a range of, for example, 1 to 180 seconds, specifically 1 to 120 seconds, more specifically 1 to 60 seconds.

The temperature of the heater 207 is set such that the temperature of the wafer 200 (first temperature) becomes a temperature which falls within a range of, for example, a room temperature (25 degrees C.) to 500 degrees C., specifically 200 to 450 degrees C., more specifically 300 to 400 degrees C.

If the first temperature is lower than the room temperature, the standby time required until the internal temperature of the process chamber 201 is elevated to and stabilized at a predetermined processing temperature (second temperature) may be prolonged when the CVD film forming step as described hereinbelow is performed after the seed layer forming step. As a result, the productivity of substrate processing may be decreased. By setting the first temperature to become higher than the room temperature, it is possible to sufficiently shorten the aforementioned standby time and to sufficiently increase the productivity of substrate processing. By setting the first temperature to become 200 degrees C. or higher, it is possible to further shorten the aforementioned standby time and to further increase the productivity of substrate processing. By setting the first temperature to become 300 degrees C. or higher, it is possible to even further shorten the aforementioned standby time and to even further increase the productivity of substrate processing.

If the first temperature exceeds 500 degrees C., DIPAS supplied into the process chamber 201 is easily pyrolyzed and an adsorption layer of DIPAS is difficult to be formed on the wafer 200. Furthermore, an excessive gas phase reaction occurs within the process chamber 201. Thus, there may be a case where an extraneous material is generated within the process chamber 201. By setting the first temperature at 500 degrees C. or lower, it is possible to suppress the pyrolysis of DIPAS or the generation of an extraneous material. By setting the first temperature at 450 degrees C. or lower, it is possible to sufficiently avoid the pyrolysis of DIPAS or the generation of an extraneous material. By setting the first temperature at 400 degrees C. or lower, it is possible to reliably avoid the pyrolysis of DIPAS or the generation of an extraneous material.

Accordingly, it is desirable that the temperature of the wafer 200 (first temperature) be set at a temperature which falls within a range of, for example, a room temperature (25 degrees C.) to 500 degrees C., specifically 200 to 450 degrees C., more specifically 300 to 400 degrees C.

The aforementioned condition is a condition under which DIPAS is not pyrolyzed (autolyzed) if DIPAS exists alone within the process chamber 201. By supplying the DIPAS gas to the wafer 200 under this condition, it is possible to moderately suppress the pyrolysis of DIPAS and to cause DIPAS to be physically adsorbed or chemisorbed onto the surface of the wafer 200. As a result, an adsorption layer (molecular layer) of DIPAS is formed on the wafer 200. At this time, at least some of S—N bonds of DIPAS adsorbed onto the wafer 200 are held (maintained) without being broken and are directly introduced into the adsorption layer of DIPAS. That is, at least some of amino ligands of DIPAS remain within the adsorption layer of DIPAS.

If the thickness of the adsorption layer of DIPAS formed on the wafer 200 exceeds several molecular layers, a modifying action (amino ligand desorbing action) at step 2 as described hereinbelow fails to reach the entirety of the adsorption layer. A minimum value of the thickness of the adsorption layer of DIPAS which can be formed on the wafer 200 is less than one molecular layer. Accordingly, it is desirable that the thickness of the adsorption layer of DIPAS be approximately from less than one molecular layer to several molecular layers. In this regard, the layer having a thickness of less than one molecular layer refers to a molecular layer formed discontinuously. The layer having a thickness of one molecular layer refers to a molecular layer formed continuously. By setting the thickness of the adsorption layer of DIPAS at one molecular layer or less, namely one molecular layer or less than one molecular layer, it is possible to relatively increase the modifying action at step 2, which will be described later, and to shorten the time required in modifying the adsorption layer at step 2. Furthermore, it is possible to shorten the time required in forming the adsorption layer of DIPAS at step 1. As a result, it is possible to shorten the processing time per one cycle and to shorten the processing time required at the seed layer forming step. By setting the thickness of the adsorption layer of DIPAS at one molecular layer or less, it is possible to enhance the controllability of the film thickness uniformity of a seed layer.

After the adsorption layer of DIPAS is formed, the valve 243a is closed to stop supplying the DIPAS gas into the process chamber 201. At this time, the interior of the process chamber 201 is vacuum-exhausted by the vacuum pump 246 while opening the APC valve 244.

Thus, the unreacted DIPAS gas, the DIPAS gas contributed to the formation of the adsorption layer of DIPAS, or the reaction byproduct, which remains within the process chamber 201, is removed from the interior of the process chamber 201. Furthermore, the supply of the $N_2$ gas into the process chamber 201 is maintained while opening the valves 243c and 243d. The $N_2$ gas acts as a purge gas. This makes it possible to enhance the effect of removing the unreacted DIPAS gas or the DIPAS gas contributed to the formation of the adsorption layer of DIPAS, which remains within the process chamber 201, from the interior of the process chamber 201.

At this time, the gas remaining within the process chamber 201 may not be completely removed and the interior of the process chamber 201 may not be completely purged. If the amount of the gas remaining within the process chamber 201 is small, there is no possibility that an adverse effect is generated at step 2 which will be performed later. In this case, it is not necessary to make large the flow rate of the $N_2$ gas supplied into the process chamber 201. For example, by supplying the $N_2$ gas substantially in the same amount as the volume of the reaction tube 203 (the process chamber 201), it is possible to perform a purge operation such that an adverse effect is not generated at step 2. By not completely purging the interior of the process chamber 201 in this way, it is possible to shorten the purge time and to improve the throughput. In addition, it is possible to suppress the consumption of the $N_2$ gas to a necessary minimum level.

As the first precursor, it may be possible to use, in addition to the DIPAS gas, various kinds of aminosilane precursor gases such as a bis-diethylaminosilane ($SiH_2[N(C_2H_5)_2]_2$, abbreviation: BDEAS) gas, a bis-tert-butylaminosilane ($SiH_2[NH(C_4H_9)]_2$, abbreviation: BTBAS) gas, a bis-diethylpiperidinosilane ($SiH_2[NC_5H_8(C_2H_5)_2]_2$, abbreviation: BDEPS) gas, a tris-diethylaminosilane ($SiH[N(C_2H)_2]_3$, abbreviation: 3DEAS) gas, a tris-dimethylaminosilane ($SiH[N(CH_3)_2]_3$, abbreviation: 3DMAS) gas, a tetrakis-dimethylaminosilane ($Si[N(CH_3)_2]_4$, abbreviation: 4DMAS) gas, a tetrakis-diethylaminosilane ($Si[N(C_2H)_2]_4$, abbreviation: 4DEAS) gas, a tetraethoxysilane ($Si(OC_2H_5)_4$, abbreviation: TEOS) gas, a hexamethyldisilazane (($CH_3)_3Si$—NH—Si($CH_3)_3$, abbreviation: HMDS) gas or the like.

As the inert gas, it may be possible to use, in addition to the $N_2$ gas, a rare gas such as an Ar gas, a He gas, a Ne gas, a Xe gas or the like.

[Step 2]

After the adsorption layer of DIPAS is formed on the wafer 200, a plasma-excited $H_2$ gas is supplied to the wafer 200 accommodated within the process chamber 201.

Specifically, the opening/closing control of the valves 243b to 243d is performed in the same procedure as the opening/closing control of the valves 243a, 243c and 243d at step 1. Furthermore, high-frequency power (RF power) (hereinafter simply referred to as electric power) is supplied to between the rod-shaped electrodes 269 and 270, whereby the $H_2$ gas supplied into the buffer chamber 237 is activated by plasma (plasma-excited). The plasma-excited $H_2$ gas ($H_2$* gas) is supplied from the buffer chamber 237 into the process chamber 201 and is exhausted from the exhaust pipe 231. At this time, the $H_2$* gas is supplied to the wafer 200.

The supply flow rate of the $H_2$ gas controlled by the MFC 241b may be set at a flow rate which falls within a range of, for example, 100 to 10,000 sccm. The supply flow rates of the $N_2$ gas controlled by the MFCs 241c and 241d may be respectively set at a flow rate which falls within a range of, for example, 100 to 10,000 sccm. The high-frequency power (RF power) (hereinafter simply referred to as electric power) applied to between the rod-shaped electrodes 269 and 270 may be set at electric power which falls within a range of, for example, 50 to 1,000 W. The internal pressure of the process chamber 201 may be set at a pressure which falls within a range of, for example, 1 to 100 Pa. The partial pressure of the $H_2$ gas within the process chamber 201 may be set at a pressure which falls within a range of, for example, 0.01 to 100 Pa. The time period, during which active species ($H_2$* or H*) obtained by plasma-exciting the $H_2$ gas are supplied to the wafer 200, namely the gas supply time period (irradiation time period), may be set at a time period which falls within a range of, for example, 1 to 120 seconds, specifically 1 to 60 seconds. Other processing conditions may be similar to the processing conditions of step 1 described above.

By supplying the $H_2$* gas to the wafer 200 under the aforementioned conditions, Si—N bonds contained in DIPAS adsorbed onto the surface of the wafer 200 can be broken by the high energy possessed by the $H_2$* gas. That is, the bonds between Si contained in the adsorption layer of DIPAS and amino ligands bonded to Si can be broken by the action of the $H_2$* gas. This makes it possible to desorb the amino ligands from the adsorption layer of DIPAS. At least some of Si atoms, which have dangling bonds due to the removal of the amino ligands, form Si—Si bonds. As a result, the adsorption layer of DIPAS formed on the wafer 200 is modified into a silicon layer (Si layer) having a thickness of from less than one atomic layer to several atomic layers. In this regard, the layer having a thickness of less than one atomic layer refers to an atomic layer formed discontinuously. The layer having a thickness of one atomic layer refers to an atomic layer formed continuously. The Si layer formed at step 2 becomes a layer which is lower in N concentration or C concentration than the adsorption layer of DIPAS formed at step 1.

After the adsorption layer of DIPAS is modified to the Si layer, the valve 243b is closed to stop supplying the $H_2$ gas. Furthermore, the supply of the electric power to between the rod-shaped electrodes 269 and 270 is stopped. The $H_2$ gas or the reaction byproduct, which remains within the process chamber 201, is removed from the interior of the process chamber 201 under the same processing procedures and processing conditions as those of step 1. At this time, similar to step 1, the $H_2$ gas or the like remaining within the process chamber 201 may not be completely discharged.

As the ligand desorption material, in addition to the $H_2$ gas, a $D_2$ gas may be used by plasma-exciting the same. Moreover, an $N_2$ gas or the aforementioned various kinds of rare gases may be used by plasma-exciting the same.

As the inert gas, it may be possible to use, in addition to the $N_2$ gas, for example, various kinds of rare gases mentioned above.

[Performing a Predetermined Number of Times]

A cycle which non-simultaneously, i.e., non-synchronously, performs steps 1 and 2 described above is implemented a predetermined number of times (n times), namely once or more. Thus, a seed layer (Si seed layer) having a predetermined thickness can be formed on the wafer 200. The aforementioned cycle may be repeated multiple times. That is, the thickness of the Si layer formed per one cycle may be set smaller than a desired thickness and the aforementioned cycle may be repeated multiple times until the thickness of the seed layer formed by laminating the Si layer becomes equal to the desired thickness. For example, the Si layer having a thickness of less than one atomic layer may be formed per one cycle and the seed layer having a thickness of one atomic layer or more and several atomic layers or less may be formed by performing the cycle multiple times. In order to uniformly shorten the growth delay time (incubation time) over the entire in-plane region of the wafer 200 at the CVD film forming step which will be described later, it is desirable that the seed layer be formed into a continuous layer, namely that the thickness of the seed layer be one atomic layer or more. The thickness of the seed layer may be set at a thickness which falls within a range of, for example, 1 to 50 Å (0.1 to 5 nm), specifically 1 to 20 Å (0.1 to 2 nm), more specifically 1 to 10 Å (0.1 to 1 nm).

(CVD Film Forming Step)

After the seed layer is formed, a $SiH_4$ gas is supplied to the wafer 200 accommodated within the process chamber 201.

Specifically, the opening/closing control of the valves 243a, 243c and 243d is performed in the same procedure as the opening/closing control of the valves 243a, 243c and 243d at step 1. The flow rate of the $SiH_4$ gas flowing through the gas supply pipe 232a is controlled by the MFC 241a. The $SiH_4$ gas is supplied into the process chamber 201 via the nozzle 249a and is exhausted from the exhaust pipe 231. At this time, the $SiH_4$ gas is supplied to the wafer 200.

The supply flow rate of the $SiH_4$ gas controlled by the MFC 241a may be set at a flow rate which falls within a range of, for example, 10 to 2,000 sccm, specifically 500 to 1,000 sccm. The supply flow rates of the $N_2$ gas controlled by the MFCs 241c and 241d may be respectively set at a flow rate which falls within a range of, for example, 100 to 10,000 sccm. The internal pressure of the process chamber 201 may be set at a pressure which falls within a range of, for example, 1 to 1333 Pa, specifically 1 to 133 Pa. The time period, during which the $SiH_4$ gas is supplied to the wafer 200, namely the gas supply time period (irradiation time period), may be appropriately decided depending on the thickness of the Si film formed on the seed layer, or the like.

The temperature of the heater 207 is set such that the temperature of the wafer 200 becomes a temperature (second temperature) equal to or higher than the first temperature mentioned above. The second temperature is a temperature equal to or higher than the first temperature mentioned above and may be set at a temperature which falls within a range of, for example, 450 to 650 degrees C., specifically 500 to 550 degrees C.

If the second temperature is lower than 450 degrees C., there may a case where the pyrolysis of $SiH_4$ is difficult to occur (the gas phase reaction is difficult to occur) and the formation process of a Si film (the CVD film forming process) is difficult to go ahead. By setting the second temperature at 450 degrees C. or higher, it is possible to appropriately generate the gas phase reaction and to reliably perform the CVD film forming process. By setting the second temperature at 500 degrees C. or higher, it is possible to appropriately generate the gas phase reaction and to more reliably perform the CVD film forming process.

If the second temperature exceeds 650 degrees C., an excessive gas phase reaction may occur. Thus, the film thickness uniformity is likely to be deteriorated and the control of the film thickness uniformity is difficult. Furthermore, there may be a case where an extraneous material is generated within the process chamber 201 and the reduction of a substrate processing quality is incurred. By setting the second temperature at 650 degrees C. or lower, it is possible to suppress the deterioration of the film thickness uniformity while generating a moderate gas phase reaction and to suppress the generation of an extraneous material within the process chamber 201. By setting the second temperature at 550 degrees C. or lower, it is easy to secure the film thickness uniformity of the Si film and it is possible to reliably suppress the generation of an extraneous material within the process chamber 201.

Accordingly, it is desirable that the temperature of the wafer 200 (the second temperature) be set at a temperature which falls within a range of, for example, 450 to 650 degrees C., specifically 500 to 550 degrees C.

The aforementioned condition is a condition under which $SiH_4$ is pyrolyzed (autolyzed) if $SiH_4$ exists alone within the process chamber 201. By supplying the $SiH_4$ gas to the wafer 200 under this condition, Si contained in $SiH_4$ is deposited on the seed layer and a Si film (CVD-Si film) having a predetermined film thickness is formed on the seed layer. Thus, there is formed a laminated film (Si film) which is obtained by laminating the seed layer and the CVD-Si film on the wafer 200. The film thickness of the CVD-Si film growing at the CVD film forming step is appropriately decided depending on the specifications of a device formed on the wafer 200, or the like and may be set at, for example, 1 to 5,000 Å. In the case where the temperature of the wafer 200 is set at a temperature which falls within a range of 450 to 520 degrees C., the CVD-Si film has a strong tendency to become an amorphous Si film. Furthermore, in the case where the temperature of the wafer 200 is set at a temperature which falls within a range of 520 to 530 degrees C., the CVD-Si film has a strong tendency to become a Si film in which amorphous and polycrystal are mixed with each other. Moreover, in the case where the temperature of the wafer 200 is set at a temperature which falls within a range of 530 to 650 degrees C., the CVD-Si film has a strong tendency to become a poly-Si film.

As the second precursor, it may be possible to suitably use, in addition to the $SiH_4$ gas, a halogen-element-free silicon hydride gas such as a $Si_2H_6$ gas, a $Si_3H_8$ gas or the like. Furthermore, as the second precursor, it may be possible to suitably use a halogen-element-containing silane precursor gas (halosilane precursor gas) such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride ($SiCl_4$, abbreviation: STC) gas, a hexachlorodisilane ($Si_2Cl_6$, abbreviation: HCDS) gas or the like. From the viewpoint of preventing a halogen element from being mixed into the CVD-Si film, it is desirable that a halogen-element-free silicon hydride gas be used as the second precursor. Furthermore, from the viewpoint of enhancing the deposition rate of the Si film, it is desirable that a halosilane precursor gas higher in reactivity than the silicon hydride gas be used as the second precursor.

As the inert gas, it may be possible to use, in addition to the $N_2$ gas, for example, various kinds of rare gases mentioned above.

After the CVD-Si film having a desired thickness is formed, the valve 243a is closed to stop the supply of the $SiH_4$ gas into the process chamber 201. Then, the unreacted gas, the gas contributed to the aforementioned reaction, or the reaction byproduct, which remains within the process chamber 201, is removed from the interior of the process chamber 201 according to the same processing procedures as those of step 1 described above. At this time, similar to step 1, the gas or the like remaining within the process chamber 201 may not be completely removed.

(Atmospheric Pressure Return Step)

After the formation of the CVD-Si film is completed, the $N_2$ gas is supplied from the gas supply pipes 232c and 232d into the process chamber 201 and is exhausted from the exhaust pipe 231. The $N_2$ gas acts as a purge gas. Thus, the interior of the process chamber 201 is purged and the gas or the reaction byproduct, which remains within the process chamber 201, is removed from the interior of the process chamber 201 (purge). Thereafter, the internal atmosphere of the process chamber 201 is substituted by an inert gas (inert gas substitution). The internal pressure of the process chamber 201 is returned to an atmospheric pressure (atmospheric pressure return).

(Unloading Step)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.
 (a) By forming the seed layer on the wafer 200 in advance, it is possible to shorten the incubation time of the CVD-Si film formed on the seed layer. Furthermore, forming the seed layer as a continuous layer allows the growth start timings of the CVD-Si film to be uniform over the entire in-plane region of the wafer 200. This makes it possible to improve the film thickness uniformity of the CVD-Si film in the plane of the wafer 200.
 (b) If the formation of the seed layer is implemented under the aforementioned processing condition, namely under the condition (temperature or pressure) in which DIPAS is not pyrolyzed if DIPAS exists alone within the process chamber 201, there may be a case where an impurity such as N or C contained in the amino ligands of DIPAS is introduced into the seed layer. In contrast, at the seed layer forming step of the present embodiment, the plasma-excited $H_2$ gas is supplied to the adsorption layer of DIPAS formed on the wafer 200. It is therefore possible to desorb the amino ligands from the adsorption layer of DIPAS and to significantly reduce an N concentration or a C concentration in the seed layer. As a result, the Si film obtained by laminating the seed layer and the CVD-Si film can be allowed to become a high-quality film which is low in the concentration of an impurity such as N or C.
 (c) At the seed layer forming step, the $H_2$ gas, which is a material not containing N and C, is used as the ligand desorption material. This makes it possible to prevent an N component or a C component from being added to the seed layer due to the execution of step 2. As a result, the Si film obtained by laminating the seed layer and the CVD-Si film can be allowed to become a high-quality film which is extremely low in the concentration of an impurity such as N or C.
 (d) At the seed layer forming step, step 1 of supplying the DIPAS gas to the wafer 200 and step 2 of supplying the plasma-excited $H_2$ gas to the wafer 200 are non-simultaneously and alternately performed. That is, step 2 of supplying the $H_2$ gas is performed after the adsorption layer of DIPAS is formed (after DIPAS is adsorbed onto the surface of the wafer 200). This makes it possible to prevent the occurrence of an excessive gas phase reaction within the process chamber 201, to suppress the generation of an extraneous material within the process chamber 201, and to improve a substrate processing quality.
 (e) At the CVD film forming step, the amino-ligand-free $SiH_4$ gas is used as the second precursor. This makes it possible to prevent an N component or a C component from being added into the CVD-Si film. As a result, the Si film obtained by laminating the seed layer and the CVD-Si film can be allowed to become a high-quality film which is extremely low in the concentration of an impurity such as N or C.
 (f) The effects mentioned above can be similarly achieved in the case where an aminosilane precursor gas other than the DIPAS gas is used as the first precursor, or in the case where a reducing gas other than the plasma-excited $H_2$ gas is used as the ligand desorption material, or in the case where a silane precursor gas other than the $SiH_4$ gas is used as the second precursor.

(4) Exemplary Modifications

The substrate processing sequence of the present embodiment is not limited to the one illustrated in FIG. 4 but may be modified as in the modifications described below.
(Modification 1)

At step 1 which is the seed layer forming step, the DIPAS gas may be exhausted from the interior of the process chamber 201 while supplying the DIPAS gas into the process chamber 201. At this time, the supply flow rate (supply rate) of the DIPAS gas supplied into the process chamber 201 may be set higher than the exhaust flow rate (exhaust rate) of the DIPAS gas exhausted from the interior of the process chamber 201. For example, a state in which the exhaust system is substantially closed, namely a state in which the DIPAS gas is substantially confined within the process chamber 201, may be created by slightly opening the APC valve 244 (reducing the opening degree of the APC valve 244) when the DIPAS gas is supplied into the process chamber 201. Moreover, this state may be maintained for a predetermined period of time.

Furthermore, at step 1 which is the seed layer forming step, the DIPAS gas may be confined within the process chamber 201 by stopping the exhaust of the DIPAS gas from the interior of the process chamber 201 when the DIPAS gas is supplied into the process chamber 201. For example, a state in which the exhaust system is completely closed, namely a state in which the DIPAS gas is completely confined within the process chamber 201, may be created by completely closing the APC valve 244 when the DIPAS gas is supplied into the process chamber 201. Moreover, this state may be maintained for a predetermined period of time.

In the present disclosure, for the sake of convenience, the state in which the exhaust system is substantially closed by slightly opening the APC valve 244, or the state in which the exhaust system is completely closed by completely closing the APC valve 244, will sometimes be simply referred to as a state in which the exhaust system is closed (a state in which the exhaust of the interior of the process chamber 201 by the exhaust system is stopped). Furthermore, in the present disclosure, for the sake of convenience, the state in which the DIPAS gas is substantially confined within the process chamber 201, or the state in which the DIPAS gas is completely confined within the process chamber 201, will sometimes be simply referred to as a state in which the DIPAS gas is confined within the process chamber 201.

Figure 4:
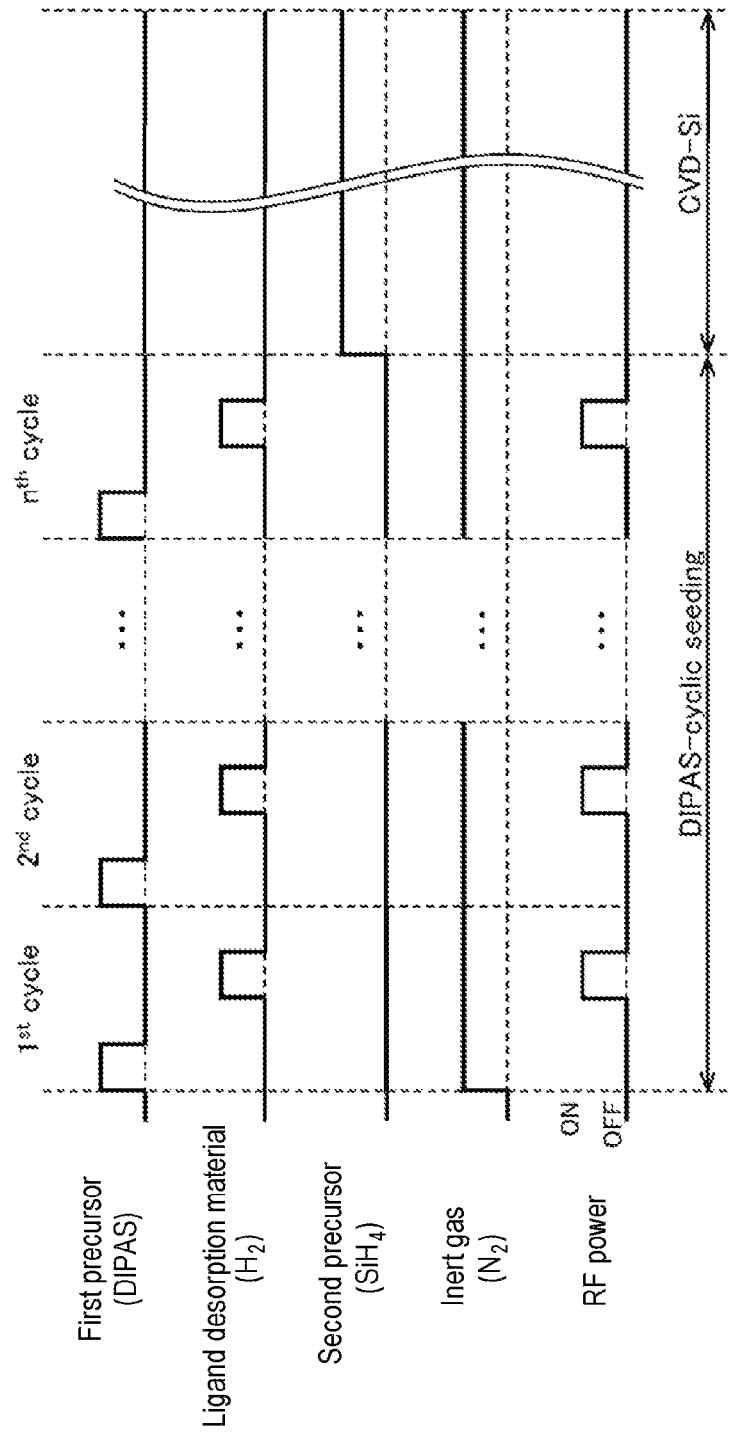
FIG. 4 is a diagram illustrating a film forming sequence according to one embodiment of the present disclosure.

Even in this modification, the same effects as those of the film forming sequence illustrated in FIG. 4 may be achieved.

Furthermore, according to this modification, the internal pressure of the process chamber 201 at step 1 can be set higher than the internal pressure at step 2 or can be set higher than the internal pressure of the process chamber 201 at the CVD film forming step. For example, the internal pressure of the process chamber 201 at step 1 can be set at a pressure which falls within a range of 1,000 to 2,000 Pa. The internal pressure of the process chamber 201 at step 2 can be set at a pressure which falls within a range of 1 to 100 Pa. The internal pressure of the process chamber 201 at the CVD film forming step can be set at a pressure which falls within a range of 1 to 500 Pa. In these cases, it is possible to promote the adsorption reaction, mainly the chemisorption reaction, of DIPAS on the wafer 200 at step 1 (to increase the chemisorption amount of DIPAS), thereby increasing the amount of Si contained in the adsorption layer of DIPAS.

Thus, even if some of Si atoms are desorbed from the adsorption layer of DIPAS by the action of the H$_2$* gas supplied at step 2, it is possible to leave a sufficient amount of Si atoms on the wafer 200. As a result, it is possible to avoid reduction of a cycle rate (seed layer formation rate) at the seed layer forming step. Furthermore, it is possible to reliably allow the seed layer to become a continuous layer. Moreover, it is possible to increase the percentage of the DIPAS gas contributed to the formation of the seed layer, namely the use efficiency of the DIPAS gas. This makes it possible to reduce the film forming cost (gas cost).

In order to efficiently achieve these effects and the effects according to the aforementioned embodiment, it is desirable that the balance of the internal pressures of the process chamber 201 between the respective steps be controlled so as to satisfy a relationship of $P_1 > P_3 \geq P_2$, specifically a relationship of $P_1 > P_3 > P_2$, where $P_1$ is the internal pressure of the process chamber 201 at step 1, $P_2$ is the internal pressure of the process chamber 201 at step 2, and $P_3$ is the internal pressure of the process chamber 201 at the CVD film forming step.

Furthermore, if the APC valve 244 is completely closed, it is possible to increase the internal pressure of the process chamber 201 within a shorter period of time and to further increase the seed layer formation rate. Moreover, it is possible to further increase the use efficiency of the DIPAS gas and to further reduce the film forming cost. In addition, if the APC valve 244 is slightly opened, it is possible to slightly form a gas flow from the interior of the process chamber 201 to the exhaust pipe 231. Thus, the reaction byproduct generated within the process chamber 201 can be removed from the interior of the process chamber 201. This makes it possible to improve the quality of the film forming process.

In the case where the exhaust of the DIPAS gas from the interior of the process chamber 201 is stopped at step 1, it is desirable that prior to performing step 2, the APC valve 244 is opened to exhaust the DIPAS gas from the interior of the process chamber 201. By doing so, it is possible to prevent the generation of an excessive gas phase reaction within the process chamber 201, to suppress the generation of an extraneous material within the process chamber 201, and to improve a substrate processing quality.

(Modification 2)

The temperature of the wafer 200 (the first temperature) used at step 1, which is the seed layer forming step, may be lowered within the aforementioned condition range and may be set, for example, lower than the temperature of the wafer 200 (the second temperature) used at the CVD film forming step. For example, the temperature of the wafer 200 used at step 1, which is the seed layer forming step, may be set at a temperature of 25 to 300 degrees C. In this case, the temperature of the wafer 200 used at step 2, which is the seed layer forming step, may be set at the same temperature (25 to 300 degrees C.) as the temperature of the wafer 200 used at step 1.

Even in this modification, the same effects as those of the film forming sequence illustrated in FIG. 4 may be achieved. Furthermore, according to this modification, by lowering the first temperature, it is possible to promote the adsorption reaction, mainly the physical adsorption reaction, of DIPAS on the wafer 200 at step 1 (to increase the physical adsorption amount of DIPAS), thereby increasing the amount of Si contained in the adsorption layer of DIPAS. As a result, similar to modification 1, even if some of Si atoms are desorbed from the adsorption layer of DIPAS by the action of the H$_2$* gas supplied at step 2, it is possible to leave a sufficient amount of Si atoms on the wafer 200. As a consequence, it is possible to avoid reduction of a cycle rate at the seed layer forming step. Furthermore, it is possible to reliably allow the seed layer to become a continuous layer.

(Modification 3)

Modifications 1 and 2 described above may be combined with each other. That is, at step 1 which is the seed layer forming step, the DIPAS gas may be substantially or completely confined within the process chamber 201. Furthermore, the temperature of the wafer 200 (the first temperature) may be lowered within the aforementioned condition range and may be set, for example, lower than the temperature of the wafer 200 (the second temperature) used at the CVD film forming step. This makes it possible to further promote the adsorption of DIPAS onto the wafer 200 at step 1 and to reliably achieve the effects set forth in modifications 1 and 2.

(Modification 4)

At step 2, a plasma-excited H$_2$ gas may be intermittently supplied to the adsorption layer of DIPAS formed on the wafer 200. An H$_2$ gas may be supplied by intermittently plasma-exciting the same.

Figure 5:
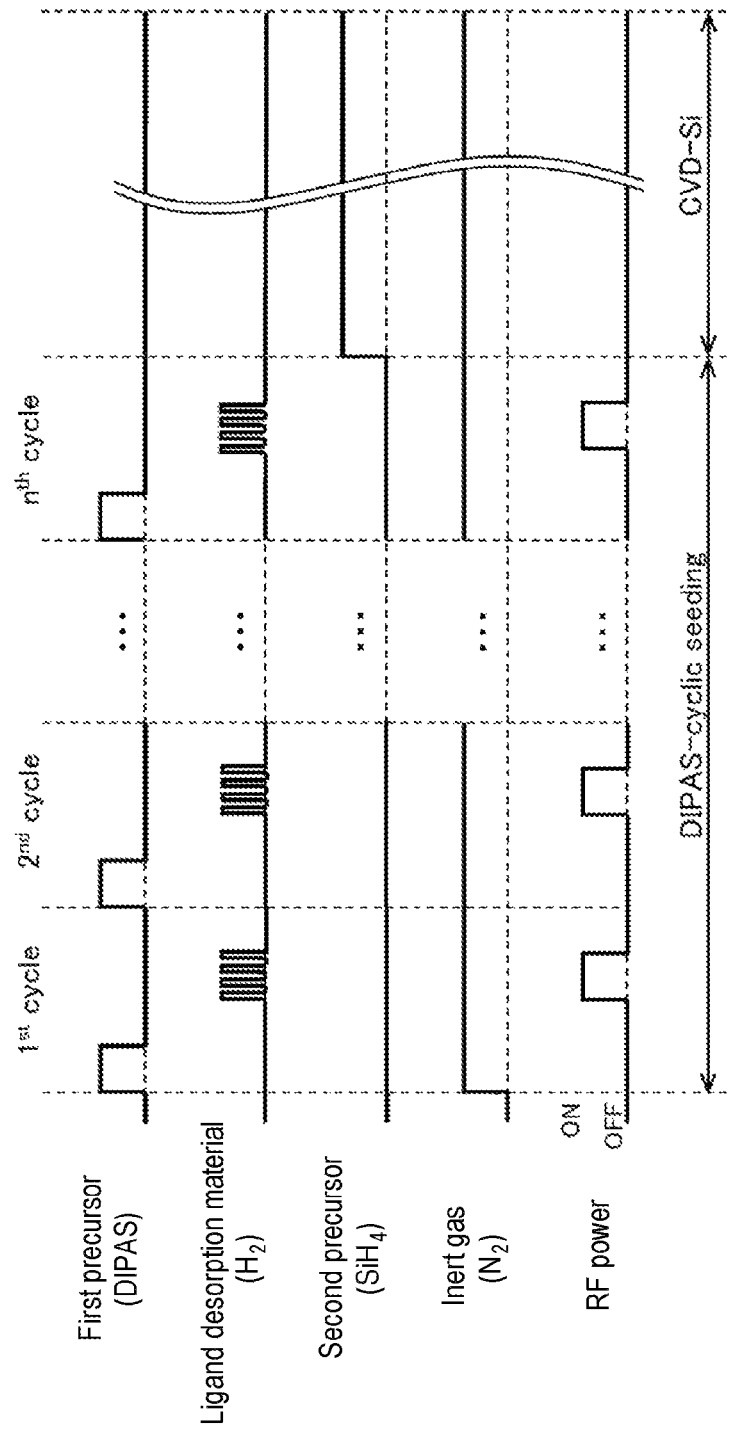
FIG. 5 is a diagram illustrating an exemplary modification of the film forming sequence according to one embodiment of the present disclosure.
Figure 6:
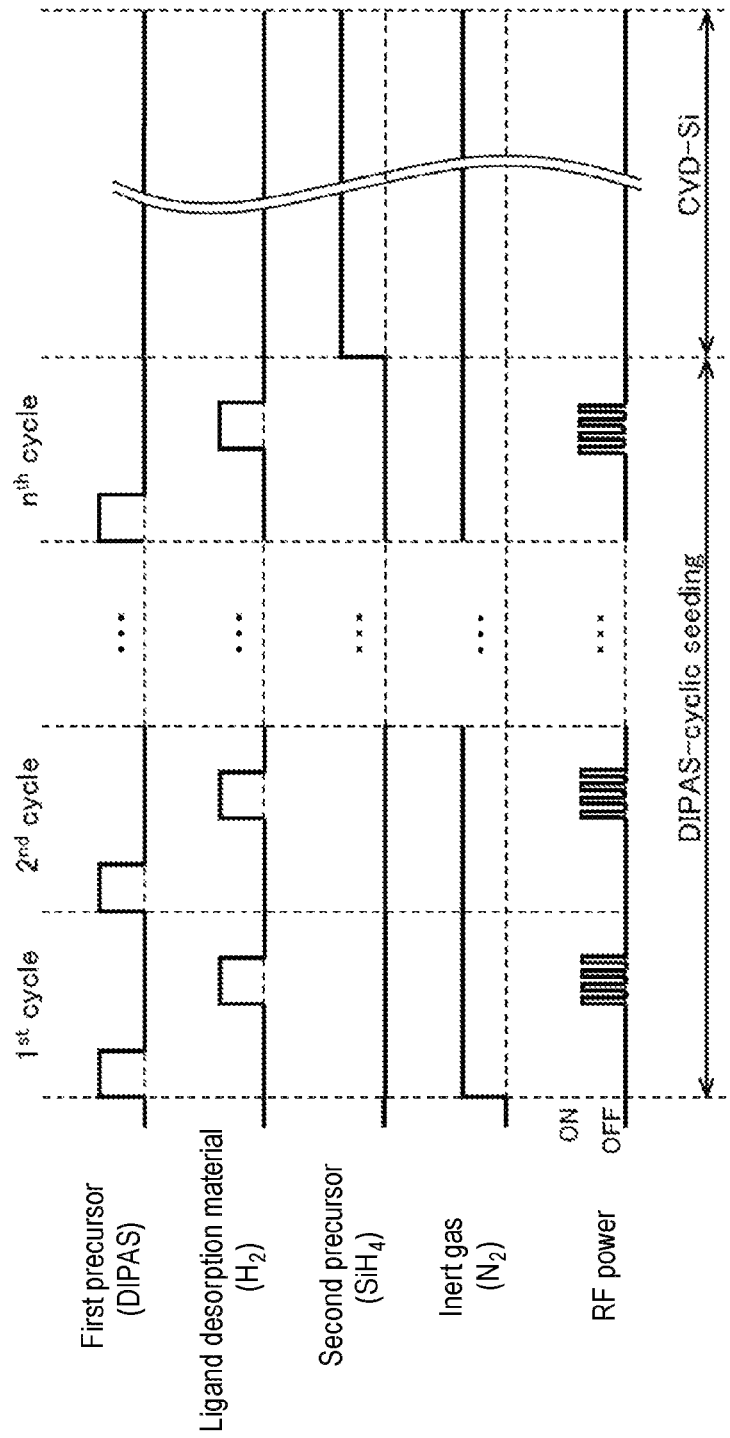
FIG. 6 is a diagram illustrating another exemplary modification of the film forming sequence according to one embodiment of the present disclosure.

For example, as illustrated in FIG. 5, at step 2, an H$_2$ gas may be intermittently supplied (in a pulse-like manner) from the nozzle 249b into the buffer chamber 237 while continuously applying the electric power for plasma-exciting the H$_2$ gas to between the rod-shaped electrodes 269 and 270. In addition, for example, as illustrated in FIG. 6, at step 2, the electric power for plasma-exciting the H$_2$ gas may be intermittently applied (in a pulse-like manner) to between the rod-shaped electrodes 269 and 270 while continuously supplying the H$_2$ gas from the nozzle 249b into the buffer chamber 237.

Even in this modification, the same effects as those of the film forming sequence illustrated in FIG. 4 may be achieved. Furthermore, according to this modification, it is possible to properly reduce the amount of the H$_2$* gas supplied to the wafer 200, namely the amount of energy applied to the adsorption layer of DIPAS, and to suppress the desorption of Si from the adsorption layer of DIPAS. Thus, when step 2 is performed, it is possible to leave a sufficient amount of Si atoms on the wafer 200 while sufficiently desorbing the amino ligands from the adsorption layer of DIPAS. As a consequence, it is possible to avoid a reduction of a cycle rate at the seed layer forming step. Furthermore, it is possible to reliably allow the seed layer to become a continuous layer.

(Modification 5)

Figure 7:
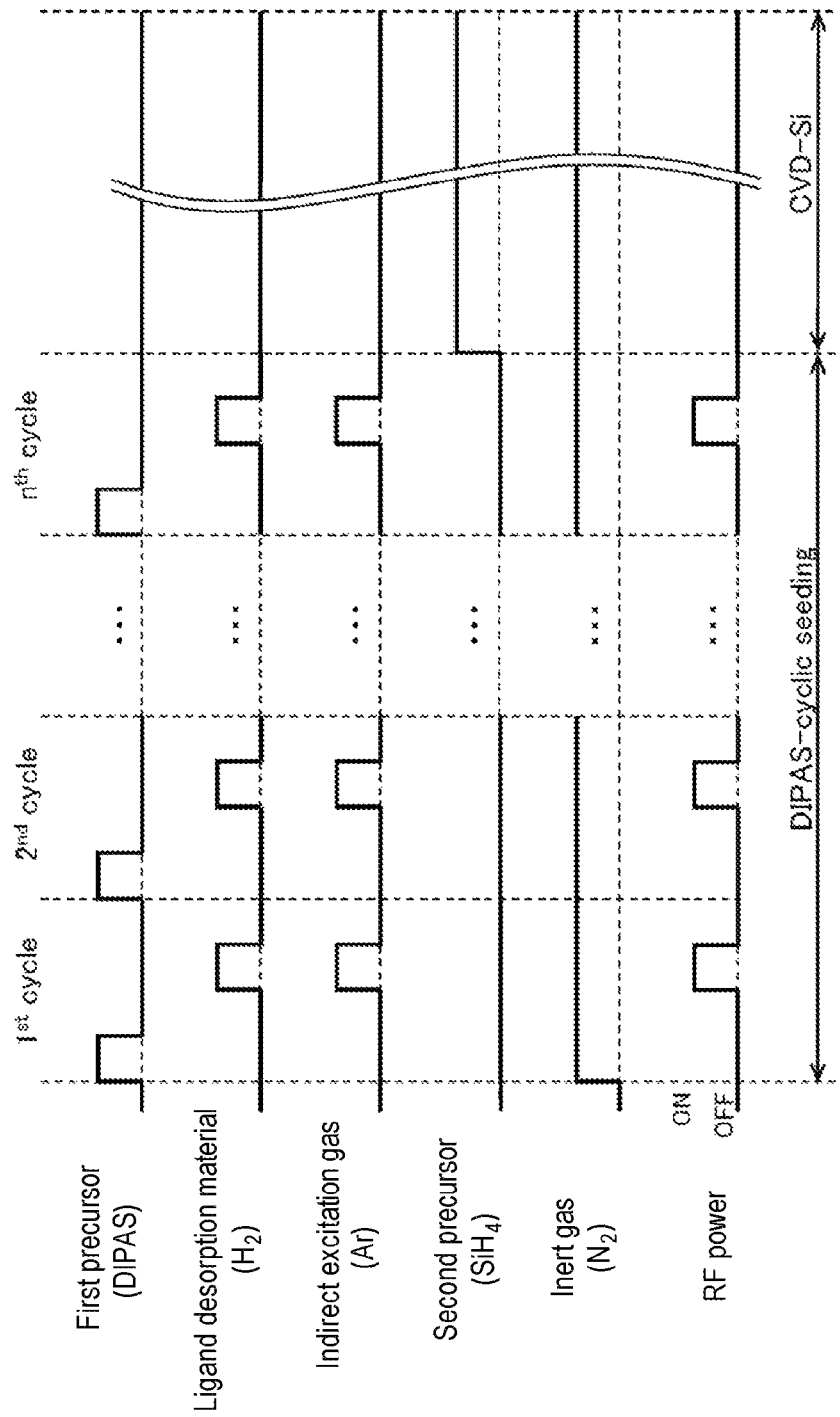
FIG. 7 is a diagram illustrating another exemplary modification of the film forming sequence according to one embodiment of the present disclosure.
Figure 8:
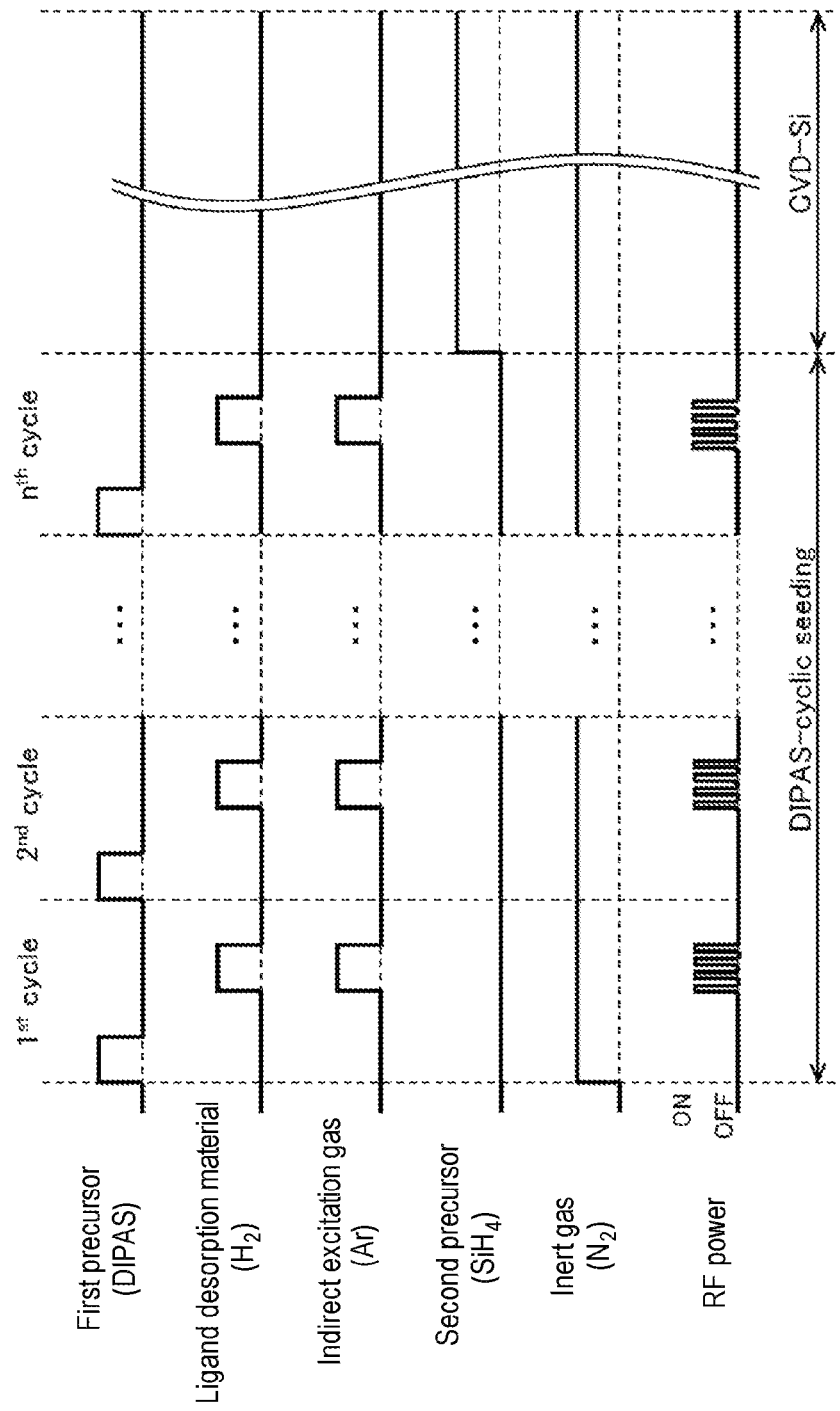
FIG. 8 is a diagram illustrating another exemplary modification of the film forming sequence according to one embodiment of the present disclosure.
Figure 9:
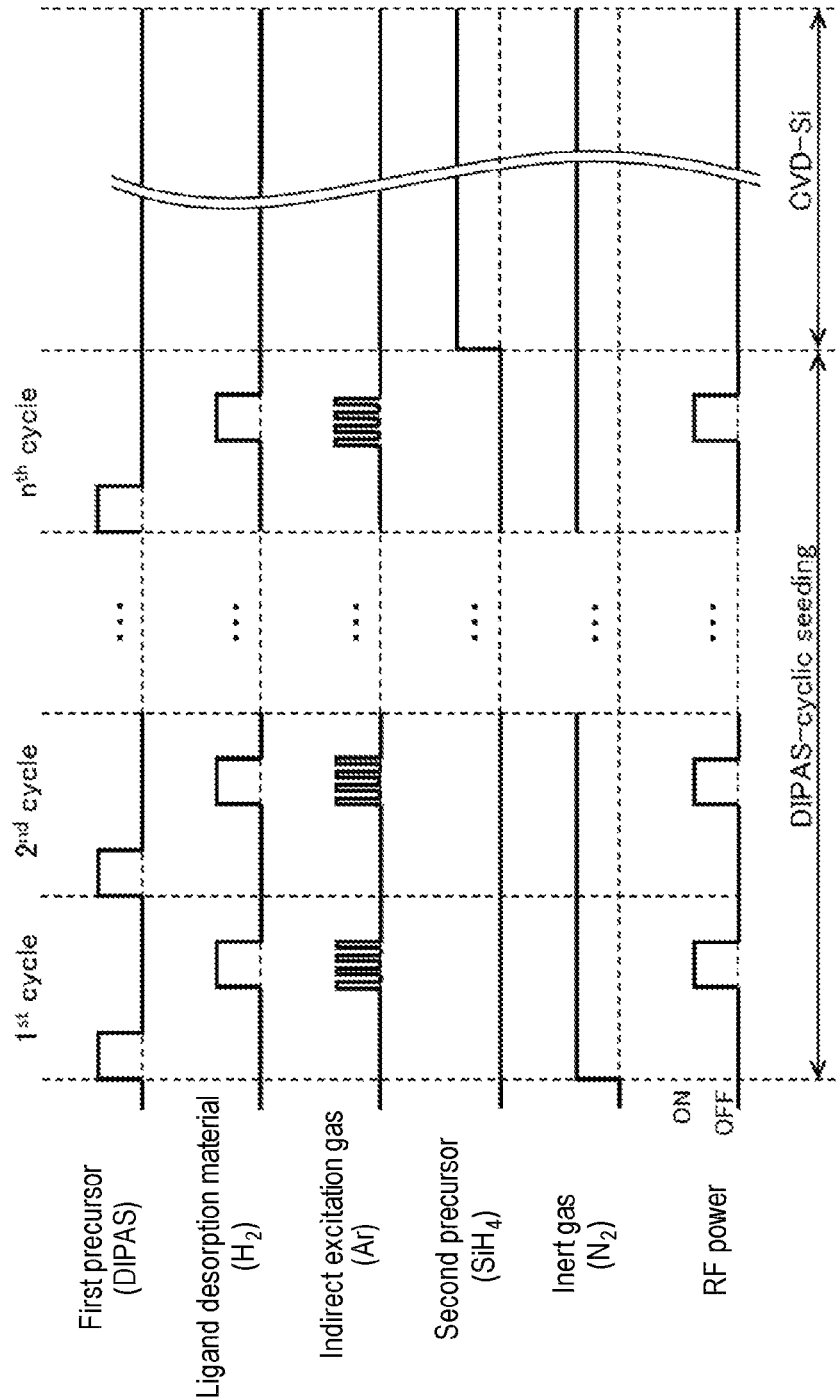
FIG. 9 is a diagram illustrating another exemplary modification of the film forming sequence according to one embodiment of the present disclosure.
Figure 10:
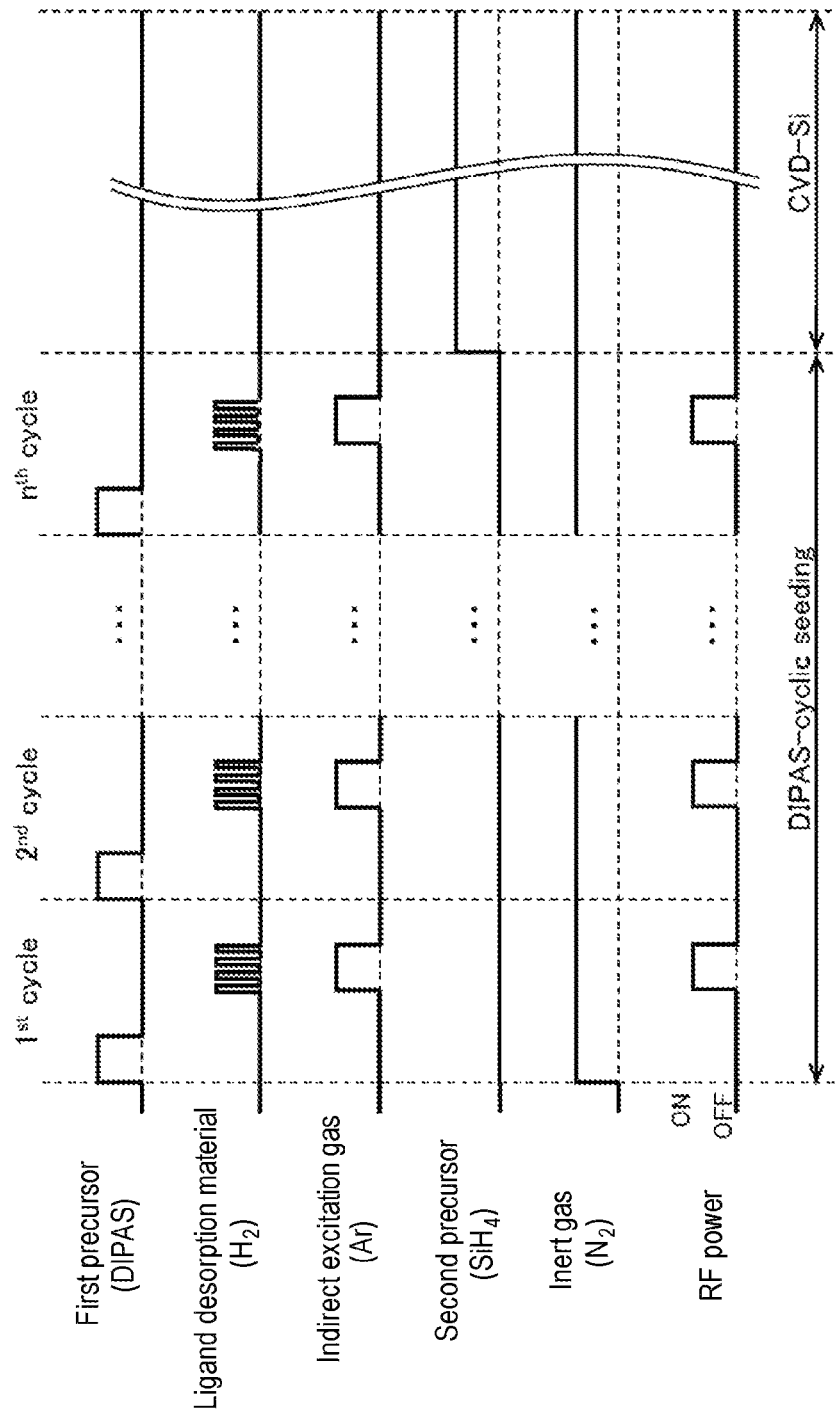
FIG. 10 is a diagram illustrating another exemplary modification of the film forming sequence according to one embodiment of the present disclosure.
Figure 11:
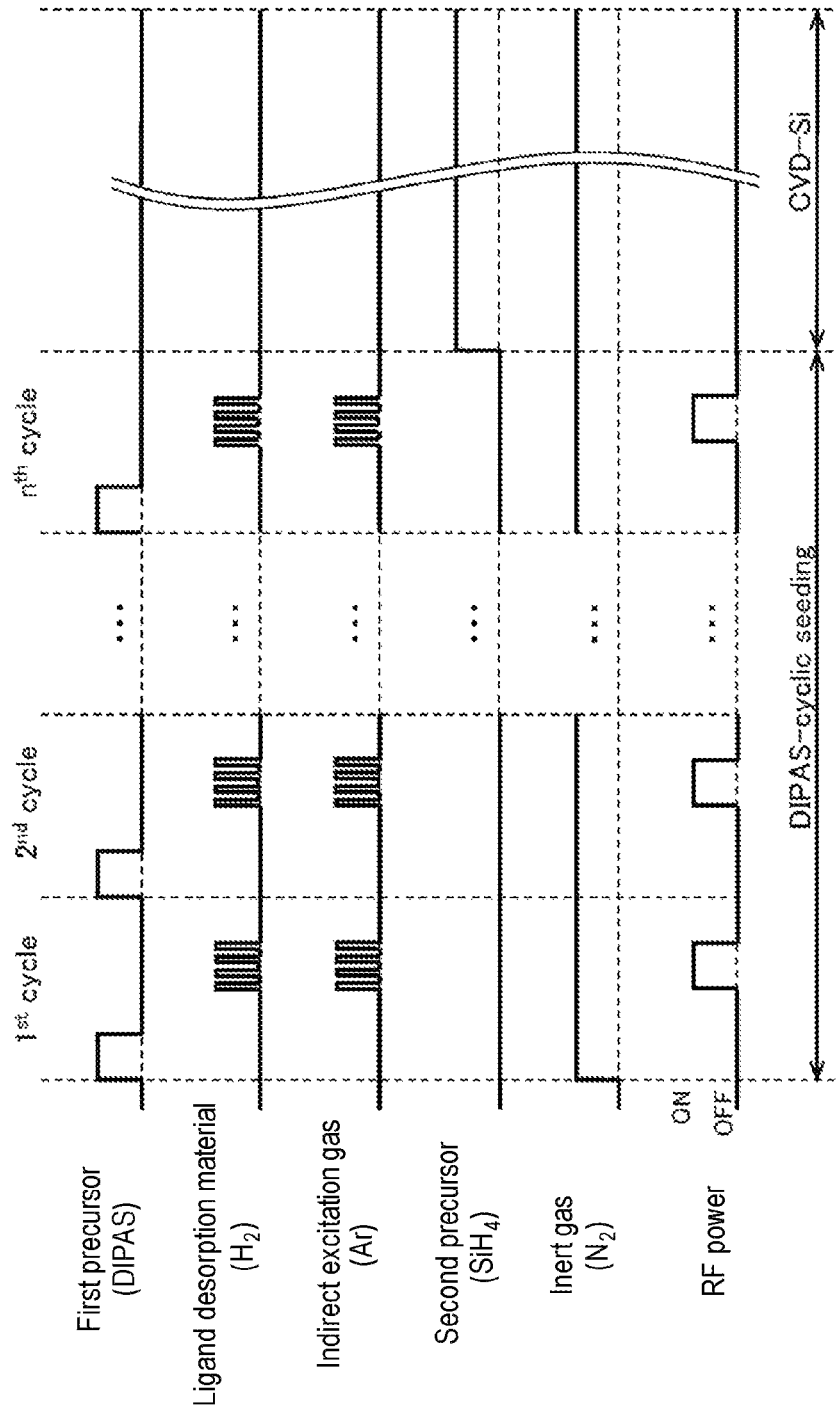
FIG. 11 is a diagram illustrating another exemplary modification of the film forming sequence according to one embodiment of the present disclosure.

As illustrated in FIG. 7, at step 2, a non-plasma-excited H$_2$ gas may be mixed (post-mixed) with a plasma-excited Ar gas (Ar* gas) within the process chamber 201. The Ar gas acts as an indirect excitation gas that indirectly excites the non-plasma-excited H$_2$ gas with plasma. In this case, the H$_2$ gas may be supplied into the process chamber 201 via the nozzle 249a. The Ar gas may be supplied into the buffer chamber 237 via the nozzle 249b. The Ar gas may be plasma-excited within the buffer chamber 237 and then may be supplied into the process chamber 201. The supply flow rate of the Ar gas controlled by the MFC 241b may be set at a flow rate which falls within a range of, for example, 100 to 10,000 sccm. The high-frequency power applied to between the rod-shaped electrodes 269 and 270 may be set at electric power which falls within a range of, for example, 50 to 1,000 W. As the indirect excitation gas, it may be possible to use, in addition to the Ar gas, an N$_2$ gas or a rare gas other than the Ar gas.

The film forming sequence of this modification may be denoted as follows.

Even in this modification, the same effects as those of the film forming sequence illustrated in FIG. 4 may be achieved. Furthermore, according to this modification, it is possible to properly reduce the amount of energy of the $H_2$ gas indirectly excited by the Ar* gas supplied to the wafer 200, namely the adsorption layer of DIPAS, and to suppress the desorption of Si from the adsorption layer of DIPAS. Thus, when step 2 is performed, it is possible to leave a sufficient amount of Si atoms on the wafer 200 while sufficiently desorbing the amino ligands from the adsorption layer of DIPAS. As a consequence, it is possible to avoid the reduction of a cycle rate at the seed layer forming step. Furthermore, it is possible to reliably allow the seed layer to become a continuous layer.

Furthermore, the aforementioned effects may be similarly achieved even in the case where a plasma-excited $N_2$ gas ($N_2$* gas) is used as the indirect excitation gas. However, if the $N_2$ gas is used as the indirect excitation gas, there may be case where N is added to the seed layer. The use of a rare gas such as an Ar gas or the like as the indirect excitation gas is desirable in that it is possible to reliably avoid addition of N into the seed layer.

(Modification 6)

At step 2 of modification 5, a non-plasma-excited $H_2$ gas may be intermittently supplied to the adsorption layer of DIPAS formed on the wafer 200, or a plasma-excited Ar gas may be intermittently supplied to the adsorption layer of DIPAS. Furthermore, at step 2, an Ar gas may be supplied by intermittently plasma-exciting the same. That is, electric power for plasma-exciting an Ar gas may be intermittently applied.

For example, as illustrated in FIGS. 8 to 11, at step 2, at least one of the supply of the $H_2$ gas into the process chamber 201 via the nozzle 249a, the supply of the Ar gas into the buffer chamber 237 via the nozzle 249b, or the application of the electric power to between the rod-shaped electrodes 269 and 270 may not be continuously performed but may be intermittently performed.

Even in this modification, the same effects as those of the film forming sequence illustrated in FIG. 4 may be achieved. Furthermore, according to this modification, it is possible to more properly reduce the amount of energy of the $H_2$ gas indirectly excited by the Ar* gas supplied to the wafer 200, namely the adsorption layer of DIPAS, and to further suppress the desorption of Si from the adsorption layer of DIPAS. Thus, when step 2 is performed, it is possible to leave a more sufficient amount of Si atoms on the wafer 200 while sufficiently desorbing the amino ligands from the adsorption layer of DIPAS. As a consequence, it is possible to more reliably avoid the reduction of a cycle rate at the seed layer forming step. Furthermore, it is possible to more reliably allow the seed layer to become a continuous layer.

(Modification 7)

At step 2, when the $H_2$ gas is supplied to the adsorption layer of DIPAS formed on the wafer 200, the $H_2$ gas may be plasma-excited using a remote plasma unit installed outside the process chamber 201. Furthermore, at step 2, when the $H_2$ gas is supplied to the adsorption layer of DIPAS formed on the wafer 200, the $H_2$ gas may be thermally excited by bringing the $H_2$ gas into contact with the hot wire 237h installed in a supply path of the $H_2$ gas and kept at an ultra-high temperature.

Even in this modification, the same effects as those of the film forming sequence illustrated in FIG. 4 may be achieved. Furthermore, according to this modification, it is possible to properly reduce the amount of energy of the $H_2$* gas supplied to the wafer 200, namely the adsorption layer of DIPAS. Thus, the same effects as those of modifications 4 to 6 may be achieved.

(Modification 8)

As described above, as the ligand desorption material, it may be possible to suitably use, in addition to the $H_2$ gas or the $D_2$ gas, a reducing gas such as a silicon hydride gas, a boron hydride gas or the like. In the case where the silicon hydride gas or the boron hydride gas is used as the ligand desorption material, it is desirable that the silicon hydride gas or the boron hydride gas be supplied in a non-plasma-excited state or in an indirectly-excited state. By doing so, when step 2 is performed, it is possible to leave a more sufficient amount of Si atoms on the wafer 200 while sufficiently desorbing the amino ligands from the adsorption layer of DIPAS. Furthermore, it is possible to suppress excessive decomposition of the silicon hydride gas or the boron hydride gas and to reduce the resultant influence on a film quality.

Furthermore, as the ligand desorption material, it may be possible to suitably use an inert gas, for example, an $N_2$ gas or a rare gas such as an Ar gas or the like. In the case where the inert gas is used as the ligand desorption material, it is desirable that the inert gas be supplied in a plasma-excited state. This is the same as the state in which the supply of the $H_2$ gas is not performed at step 2 of modification 5 or 6 at which the $H_2$ gas is supplied in an indirectly-excited state. Thus, the effects mentioned in modifications 5 and 6 may be achieved in a more reliable manner. That is, when step 2 is performed, it is possible to leave a sufficient amount of Si atoms on the wafer 200 while sufficiently desorbing the amino ligands from the adsorption layer of DIPAS. Furthermore, as described above, it is more desirable to use a plasma-excited rare gas as the ligand desorption material than to use a plasma-excited $N_2$ gas as the ligand desorption material, because the use of the plasma-excited rare gas makes it possible to reliably avoid addition of N into the seed layer.

Even in this modification, the same effects as those of the aforementioned embodiment may be achieved. Some examples of the film forming sequence of this modification are illustrated below.

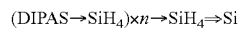

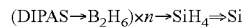

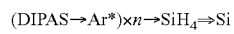

(Modification 9)

As the ligand desorption material, it may be possible to use, in addition to the reducing gas or the inert gas, a halogen-element-containing gas. In this case, the halogen-element-containing gas may include at least one gas selected from a group consisting of a Cl-containing gas and an F-containing gas.

For example, the Cl-containing gas may include at least one gas selected from a group consisting of a $Cl_2$ gas, an HCl gas and a chlorosilane gas such as a DCS gas, an HCDS gas or the like. The Cl-containing gas may include a C- and N-free Cl-containing gas.

Furthermore, for example, the F-containing gas may include at least one gas selected from a group consisting of an $F_2$ gas, an $NF_3$ gas, a $ClF_3$ gas, an HF gas and a fluorosilane gas such as a $SiF_4$ gas, a $Si_2F_6$ gas or the like. The F-containing gas may include a C- and N-free fluorine-containing gas.

The supply flow rate of the halogen-element-containing gas controlled by the MFC 241c or the like may be set at a flow rate which falls within a range of, for example, 100 to 10,000 sccm.

Some examples of the film forming sequence of this modification are illustrated below.

(DIPAS→HCl)×n→$SiH_4$⇒Si (DIPAS→DCS)×n→$SiH_4$⇒Si (DIPAS→$SiF_4$)×n→$SiH_4$⇒Si

Even in this modification, the same effects as those of the film forming sequence illustrated in FIG. 4 may be achieved. Furthermore, if a halosilane gas (especially, a chlorosilane gas) such as a DCS gas or the like among the halogen-element-containing gases is used as the ligand desorption material, it is possible to increase a cycle rate at the seed layer forming step. That is, by supplying a Si-containing halosilane gas at step 2, it is possible to desorb the amino ligands from the adsorption layer of DIPAS, to apply Si contained in the halosilane gas to the Si layer formed at that time, and to make thick the Si layer formed per one cycle. In addition, according to this modification which makes use of the active action of the halogen-element-containing gas, it is not necessary to install a plasma generation mechanism or the like. This makes it possible to simplify the structure of the substrate processing apparatus, thereby reducing the manufacturing cost or the maintenance cost of the substrate processing apparatus.

The processing procedures and processing conditions used in the respective modifications described above may be similar to the processing procedures and processing conditions of the film forming sequence illustrated in FIG. 4.

Other Embodiments of the Present Disclosure

While one embodiment of the present disclosure has been specifically described above, the present disclosure is not limited to the aforementioned embodiment but may be differently modified without departing from the spirit of the present disclosure.

For example, the present disclosure may be suitably applied to a case where various kinds of Si-containing films such as a SiN film, a SiO film, a SiCN film, a SiON film, a SiOC film, a SiOCN film, a SiBCN film, a SiBN film and the like are formed on the seed layer.

In this case, for example, a seed layer may be formed by alternately performing the supply of a first precursor and the supply of a ligand desorption material a predetermined number of times (m times). Then, the various kinds of Si-based insulation films mentioned above may be formed by non-simultaneously performing the supply of a second precursor and the supply of a reactant a predetermined number of times (n times).

As the reactant, it may be possible to suitably use, for example, an N-containing gas (N source) such as an ammonia ($NH_3$) gas or the like, a C-containing gas (C source) such as a propylene ($C_3H_6$) gas or the like, an O-containing gas (O source) such as an oxygen ($O_2$) gas or the like, an N- and C-containing gas (N and C source) such as a triethylamine (($C_2H_5$)$_3$N, abbreviation: TEA) gas or the like, and a B-containing gas (B source) such as a trichloroborane ($BCl_3$) gas or the like. These gases may be supplied by activating the same with heat or plasma.

Some examples of these film forming sequences are illustrated below.

(DIPAS→$H_2$*)×m→(HCDS→$NH_3$)×n⇒SiN (DIPAS→$H_2$*)×m→(BDEAS→$O_2$*)×n⇒SiO (DIPAS→$H_2$*)×m→(HCDS→$C_3H_6$→
$NH_3$)×n⇒SiCN (DIPAS→$H_2$*)×m→(HCDS→$NH_3$→$O_2$)×n⇒SiON (DIPAS→$H_2$*)×m→(HCDS→TEA→$O_2$)×n⇒SiOC
(N)

(DIPAS→$H_2$*)×m→(HCDS→$C_3H_6$→$NH_3$→
$O_2$)×n⇒SiOCN (DIPAS→$H_2$*)×m→(HCDS→$C_3H_6$→$BCl_3$→
$NH_3$)×n⇒SiBCN (DIPAS→$H_2$*)×m→(HCDS→$BCl_3$→$NH_3$)×n⇒SiBN

In the foregoing examples, when an oxide film such as a SiO film, a SiON film or the like is formed on the wafer 200, an O-containing gas such as an $O_2$ gas or the like may be supplied as a ligand desorption material in a plasma-excited state. For example, a SiO layer is formed as a seed layer. A SiO film or a SiON film may be formed on the SiO layer.

Furthermore, when a nitride film such as a SiN film, a SiCN film or the like is formed on the wafer 200, an N-containing gas such as an $NH_3$ gas or the like may be supplied as a ligand desorption material in a plasma-excited state. For example, a SiN layer is formed as a seed layer. A SiN film or a SiCN film may be formed on the SiN layer. In this way, the seed layer and the film formed on the seed layer may be completely consistent in composition or may be partially consistent in composition.

The present disclosure may be suitably applied to a case where a film containing a metal element such as titanium (Ti), zirconium (Zr), hafnium (Hf), tantalum (Ta), niobium (Nb), molybdenum (Mo), tungsten (W), yttrium (Y), strontium (Sr), aluminum (Al) or the like, namely a metal film, is formed on the wafer 200. That is, the present disclosure may be suitably applied to a case where, for example, a Ti film, a Zr film, an Hf film, a Ta film, an Nb film, a Mo film, a W film, a Y film, a Sr film or an Al film is formed on the wafer 200.

In this case, as the first precursor, it may be possible to use, for example, an amino titanium precursor gas containing Ti and an amino-group, such as a tetrakis-ethylmethyl-amino titanium (Ti[N($C_2H$)($CH_3$)]$_4$, abbreviation: TEMAT) gas, a tetrakis-dimethylamino titanium (Ti[N($CH_3$)$_2$]$_4$, abbreviation: TDMAT) gas, a tetrakis-diethylamino titanium (Ti[N($C_2H_5$)$_2$]$_4$, abbreviation: TDEAT) gas or the like, and an amino hafnium precursor gas containing Hf and an amino group, such as a tetrakis-dimethylamino hafnium (Hf[N($CH_3$)$_2$]$_4$, abbreviation: TDMAH) gas or the like.

Furthermore, as the ligand desorption material, it may be possible to use the same gases as used in the aforementioned embodiment.

In addition, as the second precursor, it may be possible to use, for example, a chloro titanium precursor gas containing Ti and a chloro group, such as a titanium tetrachloride ($TiCl_4$) gas or the like, a chloro hafnium precursor gas containing Hf and a chloro group, such as a hafnium tetrachloride ($HfCl_4$) gas or the like, and a gas containing Al and a methyl group, such as a trimethyl aluminum (Al($CH_3$)$_3$, abbreviation: TMA) or the like.

For example, by the film forming sequences denoted below, it is possible to form a titanium film (Ti film), a titanium aluminum carbide film (TiAlC film), a titanium aluminum nitride film (TiAlN film), a titanium oxide film (TiO film), a titanium silicon nitride film (TiSiN film), a hafnium silicon oxide film (HfSiO film), a hafnium aluminum oxide film (HfAlO film) or the like on the wafer 200.

(TDMAT→H$_2$*)×n→TiCl$_4$⇒Ti (TDMAT→H$_2$*)×m→→(TiCl$_4$→→TMA)×n⇒TiAlC (TDMAT→H$_2$*)×m→→(TiCl$_4$→→TMA→→NH$_3$)×n⇒TiAlN (TDMAT→H$_2$*)×m→→(TiCl$_4$→→O$_2$)×n⇒TiO (TDMAT→H$_2$*)×m→(TiCl$_4$→3DMAS→NH$_3$)×n⇒TiSiN (TDMAH→H$_2$*)×m→(HfCl$_4$→3DMAS→O$_2$)×n⇒HfSiO (TDMAH→H$_2$*)×m→(HfCl$_4$→TMA→O$_2$)×n⇒HfAlO

As described above, by appropriately selecting the kinds of the first precursor, the ligand desorption material and the second precursor, it is possible to form various kinds of metal-containing films such as a metal film, a metal carbide film, a metal nitride film, a metal oxide film and the like.

That is, the present disclosure may be suitably applied to a case where a film containing a semiconductor element or a metal element is formed. The processing procedures and processing conditions of the film forming process may be similar to the processing procedures and processing conditions of the embodiment or the modifications described above. Even in this case, the same effects as those of the embodiment or the modifications described above may be achieved.

Recipes (programs describing processing procedures and processing conditions) used in substrate processing may be prepared individually according to the processing contents (the kind, composition ratio, quality, film thickness, processing procedure and processing condition of the film as formed) and may be stored in the memory device 121*c* via a telecommunication line or the external memory device 123. Moreover, at the start of substrate processing, the CPU 121*a* may properly select an appropriate recipe from the recipes stored in the memory device 121*c* according to the processing contents. Thus, it is possible for a single substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. Even in these cases, the processing procedures and the processing conditions may be similar to, for example, the processing procedures and the processing conditions of the aforementioned embodiment.

Figure 12A:
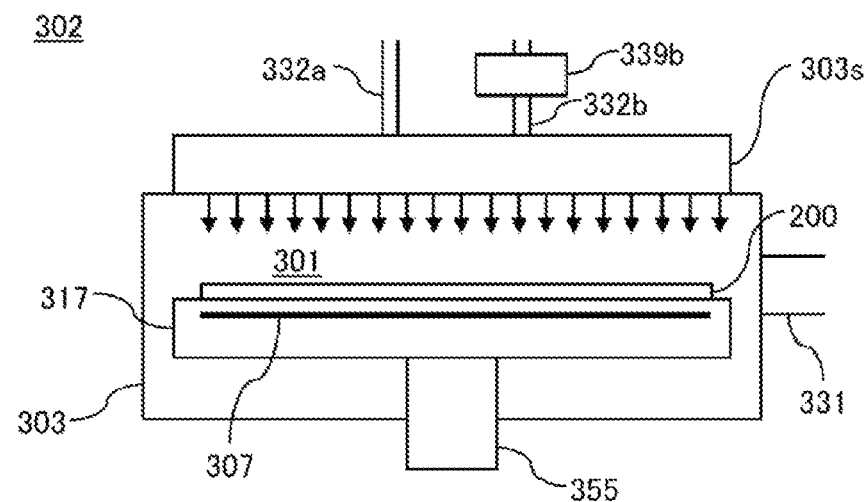
FIG. 12A is a schematic configuration diagram of a processing furnace of a substrate processing apparatus suitably used in another embodiment of the present disclosure, in which the portion of the processing furnace is shown in a vertical cross sectional view.

The present disclosure may be suitably applied to, e.g., a case where a film is formed using a substrate processing apparatus provided with a processing furnace 302 illustrated in FIG. 12A. The processing furnace 302 includes a process vessel 303 which defines a process chamber 301, a shower head 303*s* as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332*a* and 332*b* are connected to inlets (gas introduction holes) of the shower head 303*s*. A gas supply system similar to the first supply system and the second supply system of the aforementioned embodiment is connected to the gas supply port 332*a*. A remote plasma unit (plasma generation device) 339*b* as an excitation part for plasma-exciting and supplying a gas and a gas supply system similar to the third supply system of the aforementioned embodiment are connected to the gas supply port 332*b*. A gas distribution plate configured to supply a gas into the process chamber 301 in a shower-like manner is installed in outlets (gas discharge holes) of the shower head 303*s*. The shower head 303*s* is installed in such a position as to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 12B:
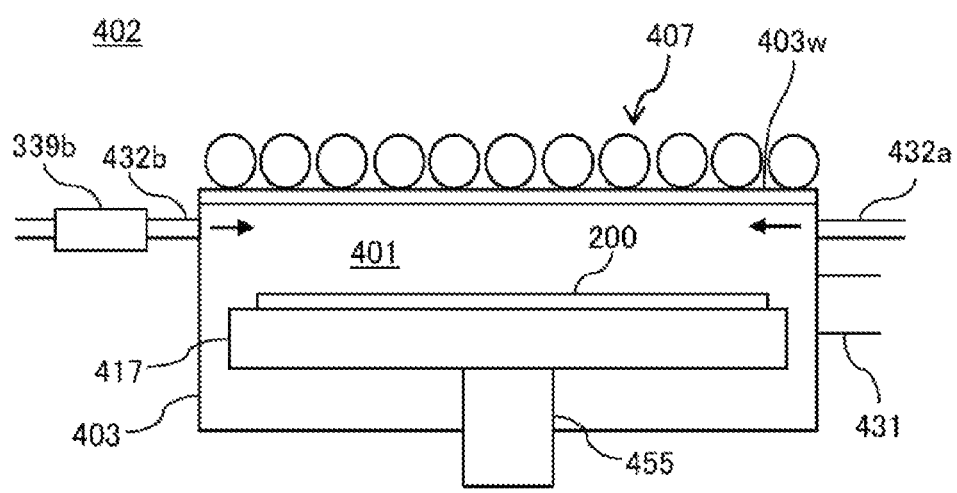
FIG. 12B is a schematic configuration diagram of a processing furnace of a substrate processing apparatus suitably used in yet another embodiment of the present disclosure, in which the portion of the processing furnace is shown in a vertical cross sectional view.

In addition, the present disclosure may be suitably applied to, e.g., a case where a film is formed using a substrate processing apparatus provided with a processing furnace 402 illustrated in FIG. 12B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403*w* which transmits the light irradiated from the lamp heater 407. Gas supply ports 432*a* and 432*b* are connected to the process vessel 403. A supply system similar to the first supply system and the second supply system of the aforementioned embodiment is connected to the gas supply port 432*a*. The aforementioned remote plasma unit 339*b* and a supply system similar to the third supply system of the aforementioned embodiment are connected to the gas supply port 432*b*. The gas supply ports 432*a* and 432*b* are respectively installed at the lateral side of the end portions of the wafers 200 carried into the process chamber 401, namely in such positions as not to face the surfaces of the wafers 200 carried into the process chamber 401. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed by the processing procedures and processing conditions similar to those of the embodiment and modifications described above. Effects similar to those of the embodiment and modifications described above may be achieved.

The embodiment and modifications described above may be appropriately combined with one another. In addition, the processing procedures and processing conditions used at this time may be similar to, for example, the processing procedures and processing conditions of the film forming sequence illustrated in FIG. 4.

According to the present disclosure in some embodiments, it is possible to improve a quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a seed layer containing a predetermined element on the substrate by performing a process a predetermined number of times, the process including alternately performing:
      (a-1) supplying a first precursor to the substrate to form an adsorption layer of the first precursor, the first precursor containing the predetermined element and a ligand which is coordinated to the predetermined element and which contains at least one selected from the group of carbon and nitrogen, and
      (a-2) supplying a ligand desorption material which includes a plasma-excited gas to the substrate to desorb the ligand from the adsorption layer of the first precursor; and
   (b) supplying a second precursor containing the predetermined element and not containing the ligand to the substrate to form a film containing the predetermined element on the seed layer,
   wherein a pressure at a space where the substrate is located in (a-1) is set higher than either a pressure at a space where the substrate is located in (a-2) or a pressure at a space where the substrate is located in (b).

2. The method of claim 1, wherein the ligand desorption material includes a plasma-excited reducing gas.

3. The method of claim 1, wherein the ligand desorption material includes a plasma-excited hydrogen-containing gas.

4. The method of claim 1, wherein the ligand desorption material includes a plasma-excited inert gas.

5. The method of claim 4, wherein the ligand desorption material further includes a halogen-element-containing gas.

6. The method of claim 4, wherein the ligand desorption material further includes a reducing gas.

7. The method of claim 4, wherein the ligand desorption material further includes a non-plasma-excited reducing gas.

8. The method of claim 7, wherein in (a-2), the plasma-excited inert gas and the non-plasma-excited reducing gas are mixed in the space where the substrate is located and supplied to the substrate.

9. The method of claim 7, wherein in (a-2), the non-plasma-excited reducing gas is intermittently supplied.

10. The method of claim 7, wherein in (a-2), the plasma-excited inert gas is intermittently supplied.

11. The method of claim 7, wherein in (a-2), the inert gas is intermittently plasma-excited and supplied.

12. The method of claim 7, wherein in (a-2), the reducing gas includes at least one selected from the group of hydrogen gas, a deuterium gas, a silicon hydride gas, and a boron hydride gas.

13. The method of claim 1, wherein the pressure at the space where the substrate is located in (a-1) is set higher than both of the pressure at the space where the substrate is located in (a-2) and the pressure at the space where the substrate is located in (b).

14. The method of claim 1, wherein a supply flow rate of the first precursor in (a-1) is set higher than an exhaust flow rate of the first precursor exhausted from the space where the substrate is located in (a-1).

15. The method of claim 1, wherein in (a-1), the first precursor is exhausted from the space where the substrate is located while supplying the first precursor into the space, and at this time, a supply flow rate of the first precursor supplied into the space is set higher than an exhaust flow rate of the first precursor exhausted from the space.

16. The method of claim 1, wherein in (a-1), an exhaust of the first precursor from a space where the substrate is located is stopped.

17. The method of claim 1, wherein (a-1) is performed under a condition in which the first precursor is not pyrolyzed, and (b) is performed under a condition in which the second precursor is pyrolyzed.

18. The method of claim 1, wherein an insulation film is formed on a surface of the substrate, and the seed layer is formed on the insulation film.

19. A method of manufacturing a semiconductor device, comprising:
   (a) forming a seed layer containing a predetermined element on a substrate by performing a process a predetermined number of times, the process including alternately performing:
      (a-1) supplying a first precursor to the substrate to form an adsorption layer of the first precursor, the first precursor containing the predetermined element and a ligand which is coordinated to the predetermined element and which contains at least one selected from the group of carbon and nitrogen, and
      (a-2) supplying a ligand desorption material which includes a plasma-excited gas to the substrate to desorb the ligand from the adsorption layer of the first precursor; and
   (b) supplying a second precursor containing the predetermined element and not containing the ligand to the substrate to form a film containing the predetermined element on the seed layer,
   wherein a pressure at a space where the substrate is located in (a-1) is set higher than either a pressure at a space where the substrate is located in (a-2) or a pressure at a space where the substrate is located in (b).

20. A substrate processing apparatus, comprising:
a process chamber configured to accommodate a substrate;
a first supply system configured to supply a first precursor to the substrate in the process chamber, the first precursor containing a predetermined element and a ligand which is coordinated to the predetermined element and which contains at least one selected from the group of carbon and nitrogen;
a second supply system configured to supply a second precursor containing the predetermined element and not containing the ligand to the substrate in the process chamber;
a third supply system configured to supply a ligand desorption material which includes a plasma-excited gas to the substrate in the process chamber; and
a controller configured to be capable of controlling the first supply system, the second supply system, and the third supply system so as to perform in the process chamber;
(a) forming a seed layer containing the predetermined element on the substrate by performing a process a predetermined number of times, the process including alternately performing:
 (a-1) supplying the first precursor to the substrate to form an adsorption layer of the first precursor, and
 (a-2) supplying the ligand desorption material to the substrate to desorb the ligand from the adsorption layer of the first precursor; and
(b) supplying the second precursor to the substrate to form a film containing the predetermined element on the seed layer,
wherein a pressure at a space where the substrate is located in (a-1) is set higher than either a pressure at a space where the substrate is located in (a-2) or a pressure at a space where the substrate is located in (b).

21. A non-transitory computer-readable recording medium storing a program that causes a computer to perform a process, the process comprising:
(a) forming a seed layer containing a predetermined element on a substrate by performing a sequence a predetermined number of times, the sequence including alternately performing:
 (a-1) supplying a first precursor to the substrate to form an adsorption layer of the first precursor, the first precursor containing the predetermined element and a ligand which is coordinated to the predetermined element and which contains at least one selected from the group of carbon and nitrogen, and
 (a-2) supplying a ligand desorption material which includes a plasma-excited gas to the substrate to desorb the ligand from the adsorption layer of the first precursor; and
(b) supplying a second precursor containing the predetermined element and not containing the ligand to the substrate to form a film containing the predetermined element on the seed layer,
wherein a pressure at a space where the substrate is located in (a-1) is set higher than either a pressure at a space where the substrate is located in (a-2) or a pressure at a space where the substrate is located in (b).

* * * * *